US011451209B2

(12) United States Patent
Gong et al.

(10) Patent No.: US 11,451,209 B2
(45) Date of Patent: Sep. 20, 2022

(54) INTERDIGITAL TRANSDUCERS ON A PIEZOELECTRIC THIN-FILM FOR SIGNAL COMPRESSION

(71) Applicant: The Board of Trustees of the University of Illinois, Urbana, IL (US)

(72) Inventors: Songbin Gong, Champaign, IL (US); Ruochen Lu, Champaign, IL (US); Tomas Manzaneque Garcia, Champaign, IL (US)

(73) Assignee: THE BOARD OF TRUSTEES OF THE UNIVERSITY OF ILLINOIS, Urbana, IL (US)

( * ) Notice: Subject to any disclaimer, the term of this patent is extended or adjusted under 35 U.S.C. 154(b) by 996 days.

(21) Appl. No.: 16/175,439

(22) Filed: Oct. 30, 2018

(65) Prior Publication Data

US 2019/0131953 A1 May 2, 2019

Related U.S. Application Data

(60) Provisional application No. 62/579,202, filed on Oct. 31, 2017.

(51) Int. Cl.
*H01L 41/09* (2006.01)
*H03H 9/02* (2006.01)
(Continued)

(52) U.S. Cl.
CPC ....... *H03H 9/02574* (2013.01); *B06B 1/0292* (2013.01); *B06B 1/0696* (2013.01);
(Continued)

(58) Field of Classification Search
CPC . H03H 9/02574; H03H 9/174; H01L 41/0973
See application file for complete search history.

(56) References Cited

U.S. PATENT DOCUMENTS

2007/0107519 A1* 5/2007 Liu ................. G01P 15/0975
73/649
2008/0084135 A1* 4/2008 Ramsesh .............. G01F 1/66
374/E11.012

(Continued)

OTHER PUBLICATIONS

Weis, R.S., and Gaylord, T.K., "Lithium Niobate: Summary of Physical Properties and Crystal Strucutre," Applied Physics A Solids and Surfaces, vol. 37 No 4, pp. 191-203, Aug. 1985.

(Continued)

*Primary Examiner* — Bryan P Gordon
(74) *Attorney, Agent, or Firm* — Lowenstein Sandler LLP

(57) ABSTRACT

A piezoelectric thin-film suspended above a carrier substrate. An input interdigital transducer (IDT) having first interdigitated electrodes is disposed at different locations along the horizontal axis and on the first side of the piezoelectric thin-film. Each opposing pair of the first interdigitated electrodes is to selectively transduce a particular frequency range of an input electrical signal that varies in frequency over time into an acoustic wave of a laterally vibrating mode based on a pitch between electrodes of the opposing pair. An output IDT that includes second interdigitated electrodes is disposed at different locations along the horizontal axis and on the second side of the piezoelectric thin-film. Each opposing pair of the second interdigitated electrodes is to convert the acoustic wave transduced by the respective opposing pair of the first interdigitated electrodes into a compressed pulse.

18 Claims, 17 Drawing Sheets

(51) Int. Cl.
| | |
|---|---|
| H03H 9/17 | (2006.01) |
| H01L 41/047 | (2006.01) |
| H01Q 3/22 | (2006.01) |
| B06B 1/02 | (2006.01) |
| B06B 1/06 | (2006.01) |
| H03H 9/145 | (2006.01) |
| H01L 41/332 | (2013.01) |
| H03H 9/15 | (2006.01) |

(52) U.S. Cl.
CPC ...... *H01L 41/0471* (2013.01); *H01L 41/0973* (2013.01); *H01L 41/332* (2013.01); *H01Q 3/22* (2013.01); *H03H 9/02228* (2013.01); *H03H 9/14555* (2013.01); *H03H 9/174* (2013.01); *H03H 2009/155* (2013.01)

(56) References Cited

U.S. PATENT DOCUMENTS

| | | | |
|---|---|---|---|
| 2008/0258843 A1* | 10/2008 | Stokes | H03H 9/1452 29/25.35 |
| 2012/0146457 A1* | 6/2012 | Goto | H03H 9/02818 310/313 B |
| 2015/0117157 A1* | 4/2015 | Li | G01K 1/00 367/189 |
| 2016/0182008 A1* | 6/2016 | Bhattacharjee | H03H 9/02574 29/25.35 |
| 2017/0155373 A1* | 6/2017 | Ruby | H03H 9/02574 |

OTHER PUBLICATIONS

Xu, G., and Jiang, Q., "A Finite Element Analysis of Second Order Effects on the Frequency Response of a SAW Device," Journal Intelligent Material Systems and Structures, vol. 12, No. 2, pp. 69-77, Feb. 2001.

Yen, T-T., Hirasawa, T., Wright, P.K., Pisano, A.P., and Lin, L., "Corrugated Aluminum Nitride Energy Harvesters for High Energy Conversion Effectiveness," Journal of Micromechanics and Microengineering, vol. 21, No. 8, pp. 1-9, Jul. 26, 2011.

Bassirian, P., Moody, J., and Bowers, S.M., "Analysis of Quadractic Dickson Based Envelope Detectors for IoE Sensor Node Applications," IEEE MTT-S Int. Microw. Symp. Dig., Honolulu, Hawaii, Jun. 2017.

Bedair, S.S., Pulskamp, J.S., Polcawich, R.G., Morgan, B., Martin, J.L., and Power, B., "Thin-Film Piezoelectric-on-Silicon Resonant Transformers," Journal of Microelectromechanical Systems, vol. 22, No. 6, pp. 1383-1394, Dec. 2013.

Brocato et al., "UWB Communication Using SAW Correlators," IEEE Radio and Wireless Conference (IEEE Cat. No. 04TH8746), pp. 267-270, 2004.

Butler, M.B.N., "Radar Applications of S.A.W. Dispersive Filters," IEEE Proc. F. Commun., Radar Singal Process., vol. 127, No. 2, pp. 118-124, Apr. 1980.

Cassella, C., Chen, G., Qian, Z., Hummel, G., and Rinaldi, M., "RF Passive Components Based on Aluminum Nitride Cross-Sectional Lame-Mode MEMS Resonators," IEEE Transactions on Electron Devices, vol. 64, No. 1, pp. 237-243, Jan. 2017.

Czaplewski, D.A. et al., "A Nanomechanical Switch for Integration with CMOS Logic," Journal of Micromechanics and Microengineering, vol. 19, No. 8, 085003, 12 pages, Jul. 2009.

Darinskii, A.N., Weihnacht, M., and Schmidt, H., "Surface Acoustic Wave Scattering from Steps, Grooves, and Strips on Piezoelectric Substrates," IEEE Transactions on Ultrasonics, Ferroelectrics, and Frequency Control, vol. 57, No. 9, pp. 2042-2050, Sep. 2010.

Fatemi, H., and Abdolvand, R., "High-Frequency Thin-Film Piezoelectric Transformer," IEEE Int. Freq. Control Symp., Baltimore, Maryland, pp. 1-4, May 2012.

Gallagher, D.R., and Malocha, D.C., "Ultra Wide Band Dual Orthogonal Frequency Coded SAW Correlators Using Harmonic Operation," IEEE Int. Frequency Control Symp., Newport Beach, CA, pp. 301-306, 2010.

Gong, S., and Piazza, G., "Design and Analysis of Litium-Niobate-Based High Electromechanical Coupling RF-MEMS Resonators for Wideband Filtering," IEEE Transactions on Microwave Theory and Techniques, vol. 61, No. 1, pp. 403-414, Jan. 2013.

Gong, S., and Piazza, G., "Monolithic Multi-Frequency Wideband RF Filters Using Two-Port Laterally Vibrating Lithium Niobate MEMS Resonators," Journal of Microelectromechanical Systems, vol. 23, No. 5, pp. 1188-1197, Oct. 2014.

Gong, S., Piazza, G., "Figure-of-Merit Enhancement for Laterally Vibrating Lithium Niobate MEMS Resonators," IEEE Transactions on Electron Devices, vol. 60, No. 11, pp. 3888-3894, Nov. 2013.

Hartmann, C.S., and Abbott, B.P., "Overview of Design Challenges for Single Phase Unidirectional SAW Filters," Proc. IEEE Ultrasonics Symposium, Montreal, QC, Canada, vol. 1, pp. 79-89, Oct. 1989.

Hartmann, C.S., Bell, D.T., and Rosenfeld, R.C., "Impulse Model Design of Acoustic Surface-Wave Filters," IEEE Transactions on Microwave Theory and Techniques vol. MTT-21, No. 4, pp. 162-175, Apr. 1973.

Hays, R.M., and Hartmann, C.S., "Surface-Acoustic-Wave Devices for Communications," Proceedings of the IEEE, vol. 64, No. 5, pp. 652-671, May 1976.

Jiang, H., et al., "A 4.5 nW Wake-up Radio with -69dBm Sensitivity," IEEE International Solid-State Circuits Conference (ISSCC) Dig. Tech. Papers, San Francisco, CA, pp. 416-417, Feb. 8, 2017.

Kadota, M., Ogami, T., Yamamoto, K., Tochishita, H., and Negoro, Y., "High-Frequency Lamb Wave Device Composed of MEMS Structure Using LiNbO3 Thin Film and Air Gap," IEEE Transactions on Ultrasonic, Ferroelectrics, and Frequency Control, vol. 57. No. 11, pp. 2564-2571, Nov. 2010.

Kando H., et al., "Plate Wave Resonator Using Rotated Y-Cut Single Crystal LiTaO3 Thin Film Made by Ion Implant Technology," Proceedings of Asia-Pacific Microwave Conference, Yokohama, Japan, pp. 920-923, Dec. 2010.

Kando, H., et al., "Improvement in Temperature Characteristics of Plate Wave Resonator Using Rotated Y-Cut LiTaO3/Sin Structure," Proc. IEEE 24th Int. Conf. Micro Elect. Mech. Syst. (MEMS), Cancun, Mexico, pp. 768-771, Jan. 23-27, 2011.

Klauder, J.R., et al. "The Theory and Design of Chirp Radars," Bell System Technical Journal vol. 39, No. 4, pp. 745-808, Jul. 1960.

Kuznetsova, I.E., et al., "Investigation of Acoustic Waves in Thin Plates of Lithium Niobate and Lithium Tantalate," IEEE Transactions on Ultrasonics, Ferroelectrics, and Frequency Control, vol. 48, No. 1, pp. 322-328, Jan. 2001.

Lee, J.O. et al., "A Sub-1-Volt Nanoelectromechanical Switching Device," Nature Nanotechnology vol. 8, No. 1, pp. 36-40, Nov. 2012.

Lin, C-M, et al., "Temperature-Compensated Aluminum Nitride Lamb Wave Resonators," IEEE Transactions on Ultrasonic Ferroelectrics, and Frequency Control, vol. 57, No. 3, pp. 524-532, Mar. 2010.

Liu, R., Nilci, J.N., Li, W-C, Nguyen, C. T-C, "Soft-Impacting Micromechanical Resoswitch Zero-Quiescent Power AM Receiver," Proc. IEEE 29th Int. Conf. Micro Elect. Mech. Syst, (MEMS), Shanghai, China, pp. 51-54, Jan. 24-28, 2016.

Lu, R., and Gong, S., "Study of Thermal Nonlinerity in Lithium Niobate-Based MEMS Resonators," Proc. 18th Int. Conf. Solid-State Sens., Actuators, Microsyst., (Transducers), Anchorage, AK, USA, pp. 1993-1996, Jun. 21-25, 2015.

Lu, R., Manzaneque, T., Breen, M., Gao, A., and Gong, S., "Piezoelectric RF Resonant Voltage Amplifiers for IoT Applications," IEEE MTT-S Int. Microw. Symp. Dig., San Francisco, California, pp. 1-4, May 2016.

Lu, R., Manzaneque, T., Yang, Y., and Gong, S., "Lithium Niobate Phononic Crystals for Radio Frequency SH0 Waves," Proc. IEEE Int. Frequ. Control Symp., Besancon, France, pp. 846-849, Jul. 2017.

Magno, M. and Benini, L., "An Ultra Low Power High Sensitivity Wake-Up Radio Receiver with Addressing Capability," In 2014 IEEE 10th Intenational Conference on Wireless and Mobile Computing, Networking and Communications (WiMob), 2014 The Second International Workshop on GReen Optimized Wireless Networks, pp. 92-99, 2014.

(56) References Cited

OTHER PUBLICATIONS

Malocha, D.C, Puccio, D., and Gallagher, D., "Orthogonal Frequency Coding for SAW Device Applications," IEEE Ultrasonics Symposium, vol. 2, pp. 1082-1085, 2004.

Manazneque, T, Lu, R., Yang, Y., and Gong, S., "An SH0 Lithium Niobate Dispersive Delay Line for Chirp Compression-Enabled Low Power Radios," Micro Electro Mechanical Systems (MEMS), IEEE 29th International Conference, Las Vegas, Nevada , pp. 155-158, Jan. 22-26, 2017.

Manzaneque, T., Lu, R., Yang, Y., and Gong, S., "A High FOM Lithium Niobate Resonant Transformer for Passive Voltage Amplification," Proc. Transducers, Kaohsiung, Taiwan, pp. 798-801, Jun. 18-22, 2017.

Moody et al., "An 8.3 nW-72dBm Event Driven IoE Wake Up Receiver RF Front End," Proceeding of the 12th European Microwave Integrated Circuit Conference (EuMIC), Nuremberg, Germany, pp. 77-80 Oct. 9-10, 2017.

Nalamwar, A.L. and Epstein, M., "Immittance Characterization of Acoustic Surface-Wave Transducers," Proceedings of the IEEE, vol. 60, No. 3, pp. 336-337, Mar. 1972.

Olsson R.H., et al., "A High Electromechanical Coupling Coefficient SH0 Lamb Wave Lithium Niobate Micromechanical Resonator and a Method for Fabrication," Sensors and Actuators A: Physical 209, pp. 183-190, 2014.

Olsson, R. H., Wojciechowski, K. E., Tuck, M.R., Stevens, J.E., "Microresonant Impedance Transformers," IEEE International Ultrasonic Symposium Procceings, Rome, Italy, pp. 2153-2157, Sep. 2009.

Olsson, R.H., Bogoslovov, R.B., and Gordon, C., "Event Driven Persistent Sensing: Overcoming the Energy and Lifetime Limitations in Unattended Wireless Sensors," Proc IEEE Sensors, Orlando, Florida, pp. 1-3, Oct. 2016.

Pop, F.V., Kochhar, A.S., Vidal-Alvarez, G., and Piazza, G., "Laterally Vibrating Lithium Niobate MEMS Resonators with 30% Electromechanical Coupling Coefficient," IEEE 30th International Conference on Micro Electro Mechanical Systems (MEMS), Las Vegas, NV, pp. 966-969, Jan. 22-26, 2017.

Reindl, L., Rosler, U., Rupple, C.C.W., Obertreis, R., and Weigel, R., "Chirped SAW Devices for Wireless Passive Sensors," Proc. IEEE Ultrasonic Symposium, Int. Symp., vol. 1, Toronto, ON, Canada, pp. 343-347, 1997.

Roberts, N.E., and Wentzloff, D.D., "A 98nW Wake-up Radio for Wireless Body Area Networks," In 2012 IEEE Radio Frequency Integrated Circuits Symposium, pp. 373-376, 2012.

Schulz, M.B., and Matsinger, J.H., "Rayleigh-Wave Electromechanical Coupling Constants," Applied Physics Letters vol. 20, No. 9, pp. 367-369, May 1, 1972.

Shi, L., and Piazza, G., "Lithium Niobate on Silicon Dioxide Suspended Membranes: A Technology Platform for Engineering the Temperature Coefficient of Frequency of High Electromechanical Coupling Resonators," Journal of Microelectromechanical Systems, vol. 23, No. 6, pp. 1318-1329, Dec. 2014.

Slobodnik, A.J., "Surface Acoustic Waves and SAW Materials," Proceedings of the IEEE, vol. 64, No. 5, pp. 581-595, May 1976.

Smith, W.R., Gerard, H.M., and Jones, W.R., "Analysis and Design of Dispersive Interdigital Surface-Wave Transducers," IEEE Transactions on Microwave Theory and Techniques, vol. MTT-20, No. 7, pp. 458-471, Jul. 1972.

Song, Y-H, and Gong, S., "Elimination of Spurious Modes in SH0 Lithium Niobate Laterally Vibrating Resonators," IEEE Electron Device Letters vol. 36, No. 11, pp. 1198-1201, Nov. 2015.

Song, Y-H., and Gong, S., "Wideband RF Filters Using Medium-Scale Integration of Lithium Niobate Laterally Vibrating Resonators," IEEE Electron Device Letters vol. 38, No. 3, pp. 387-390, Mar. 2017.

Springer, A., Gugler, W., Huemer, M., Koller, R., and Weigel, R., "A Wireless Spread-Spectrum Communication System Using SAW Chirped Delay Lines," IEEE Transactions Microwave Theory and Techniques, vol. 49, No. 4, pp. 754-760, Apr. 2001.

Toda, K., and Mizutani, K., "Propagation Characteristics of Plate Waves in a Z-Cut X-Propagation LiTaO3 Thin Plate," Electronics Commununications in Japan, Part 3, vol. 72, No. 8, Fundam Electron Sci., vol. 72, No. 8, pp. 11-21, 1989.

Torfs, T., et al., "Low Power Wireless Sensor Network for Building Monitoring," IEEE Sensors Journal, vol. 13, No. 3, pp. 909-915, Mar. 2013.

Wang, R., Bhave, S.A., and Bhattacharjee, K., "Design and Fabrication of S0 Lamb-Wave Thin-Film Lithium Niobate Micromechanical Resonators," Journal of Microelectromechanical Systems, vol. 24, No. 2, pp. 300-308, Apr. 2015.

Wang, R., Bhave, S.A., Zhgoon, S., and Bhattacharjee, K., "Multi-Frequency LiNbo3 Lamb Wave Resonators with <3Ω Impedance," Proc. IEEE 29th Int. Conf. Micro Elect. Mech. Syst. (MEMS) Shanghai, China, pp. 679-682, Jan. 24-28, 2016.

* cited by examiner

INTERDIGITAL TRANSDUCERS ON A PIEZOELECTRIC THIN-FILM FOR SIGNAL COMPRESSION

REFERENCE TO EARLIER FILED APPLICATION

This application claims the benefit under 35 U.S.C. § 119(e) of U.S. Provisional Patent Application No. 62/579,202, filed Oct. 31, 2017, which is incorporated herein, in its entirety, by this reference.

TECHNICAL FIELD

Embodiments of the disclosure relate generally to passive voltage gain devices, and more specifically, relate to interdigital transducers on a piezoelectric thin-film for signal compression.

BACKGROUND

The development of networks of miniaturized sensors and big data processing techniques are demanding an unprecedented level of wireless connectivity between objects. The combination of sensing, wireless, and data analytics has been envisioned to enable a new technological paradigm known as the Internet of Things (IoT).

BRIEF DESCRIPTION OF THE DRAWINGS

A more particular description of the disclosure briefly described above will be rendered by reference to the appended drawings. Understanding that these drawings only provide information concerning typical embodiments and are not therefore to be considered limiting of its scope, the disclosure will be described and explained with additional specificity and detail through the use of the accompanying drawings.

DETAILED DESCRIPTION

Figure 1:
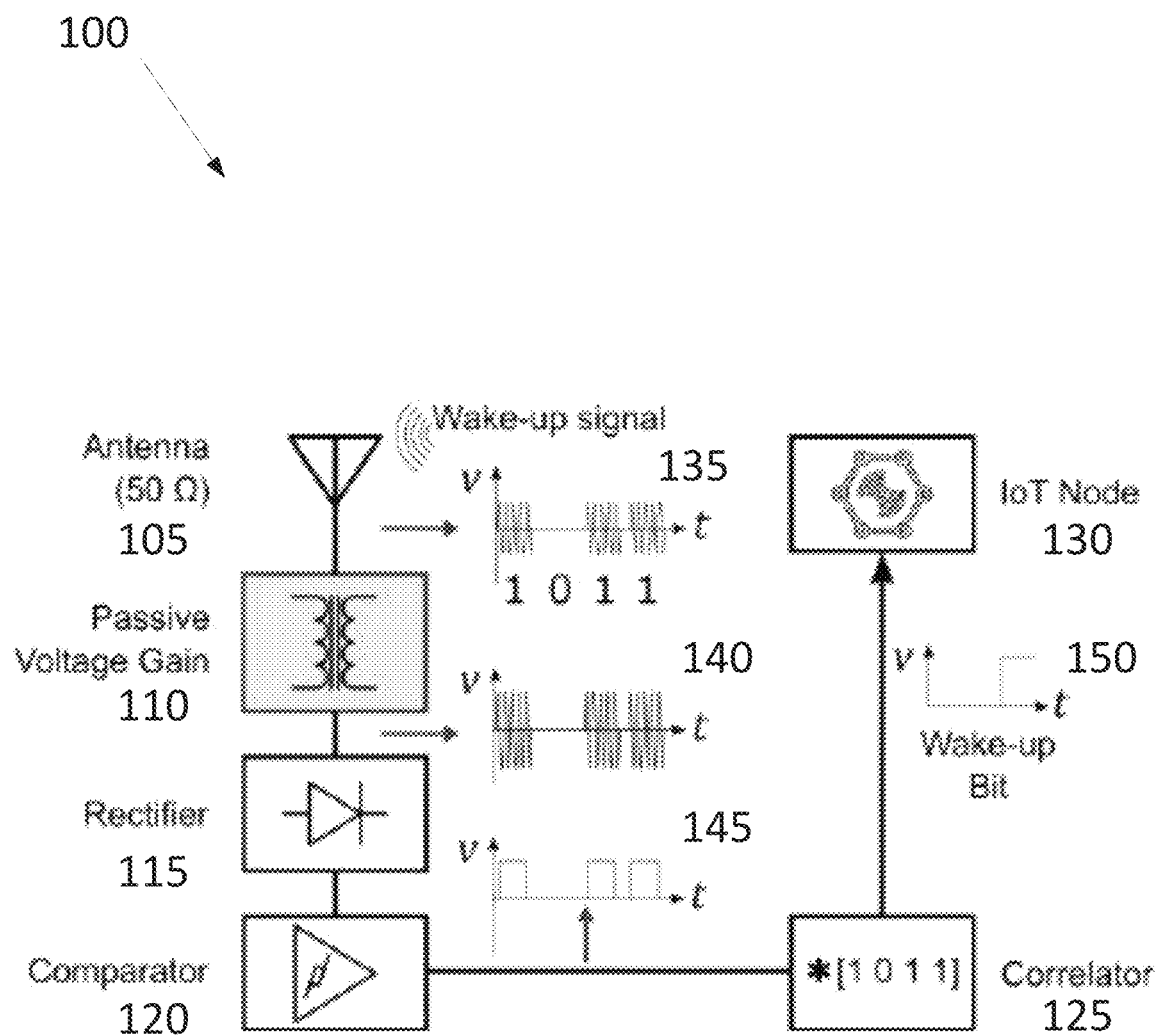
FIG. 1 illustrates a low power wake-up radio that implements a passive voltage gain device, according to embodiments of the present disclosure.

By way of introduction, the present disclosure relates to passive voltage gain device with interdigital transducers on a piezoelectric thin-film.

One of the challenges for IoT lies in maintaining wireless communication to the internet with a minimum amount of power, as many devices in IoT will be battery-powered and cannot afford power-hungry transceivers that significantly reduce the operation time. Although powering schemes alternative to batteries, such as energy harvesting from the environment, are considered promising for IoT nodes, the power levels generated from them remain relatively low. For these reasons, reducing the power budget of wireless communication links is of great interest for IoT applications, among others.

In many scenarios, connectivity and other power consuming functions can be event-driven, with long inactive periods between events. In such cases, the power consumption can be drastically reduced if devices are kept dormant for inactive periods, and are enabled upon request by a wake-up signal. In this approach, a small part of the device (e.g., IoT node) remains active at all times, with the only function of detecting the wake-up signal and enabling the rest of the device. It is desirable that the wake-up radio consume near zero power (<10 nW) to significantly improve the autonomy of an event-driven sensor node. In addition, it is desirable that the wake-up radio have a high sensitivity to the wake-up signal, since, otherwise, the need for transmitting high power signals between nodes could outweigh the power saving from disabling the nodes during inactive periods. Recently, low power wake-up receivers are becoming one of the considered enabler technologies for the IoT.

Aspects of the present disclosure address the above challenges among others by using a passive voltage gain device. The passive voltage gain device includes a piezoelectric thin-film suspended above a carrier substrate. The piezoelectric thin-film has a horizontal axis orientated along a length of the piezoelectric thin-film and a center axis orientated along a width of the piezoelectric thin-film. The horizontal axis is perpendicular to the center axis. The piezoelectric thin-film includes a first side and a second side with respect to the center axis. The passive voltage gain device includes an input interdigital transducer (IDT) that has first interdigitated electrodes disposed at different locations along the horizontal axis and on the first side of the piezoelectric thin-film. Each opposing pair of the first interdigitated electrodes is to selectively transduce a particular frequency range of an input electrical signal that varies in frequency over time into an acoustic wave of a laterally vibrating mode based on a pitch between electrodes of the opposing pair. The passive voltage gain device includes an output IDT having second interdigitated electrodes disposed at different locations along the horizontal axis and on the second side of the piezoelectric thin-film. Each opposing pair of the second interdigitated electrodes corresponds to a respective opposing pair of the first interdigitated electrodes of equal pitch. Each opposing pair of the second interdigitated electrodes is to convert the acoustic wave transduced by the respective opposing pair of the first interdigitated electrodes into a compressed pulse.

In some embodiments, the acoustic wave travels within the piezoelectric thin-film in at least one of a shear-horizontal (SH0) laterally vibrating mode or a length extensional (S0) laterally vibrating mode. The piezoelectric thin-film is one of lithium niobate thin-film or lithium tantalate thin-film. In some embodiments, the piezoelectric thin-film includes one of an X-cut, Z-cut, Y-cut, or rotated X, Y, or Z-cut lithium niobate thin-film. In one embodiments, the piezoelectric thin-film includes 38 degree rotated Y-cut lithium niobate thin-film.

In some embodiments, the input IDT and the output IDT are symmetric about the center axis. The first opposing pair of the first interdigitated electrodes that is nearest to the center axis has an equal pitch and is located an identical distance from the center axis as a corresponding first opposing pair of the second interdigitated electrodes that is nearest to the center axis. The second opposing pair of the first interdigitated electrodes that is farthest from the center axis has a equal pitch and is located an identical distance from the center axis as a corresponding second opposing pair of the second interdigitated electrodes that is farthest from the center axis. In some embodiments, the pitches of opposing pairs of the first interdigitated electrodes vary along the horizontal axis.

In some embodiments, the passive voltage gain device is a chirp compressor. The input electrical signal received at the input IDT is an input chirp signal (e.g., up-frequency chirp signal or down-frequency chirp signal) with a bandwidth (B) and a duration (T) that varies in frequency over time. The frequency components of the input chirp signal are collected at the output IDT concurrently to form the compressed pulse. The power of the chirp signal is condensed resulting in an instantaneous power amplification of a time-bandwidth (TB) product to signal. A chirp signal is a monotonic electrical signal where the frequency of the signal changes over time. For example, an up-frequency chirp signal changes from a lower frequency to a higher frequency over time. A down-frequency chirp signal changes from a higher frequency to a lower frequency over time.

In some embodiments, the passive voltage gain device is a correlator. The input electrical signal received at the input IDT comprises discrete frequency components arranged in an order in time. The discrete frequency components of the input electrical signal are collected at the output IDT concurrently to form the compressed pulse having a voltage gain greater than one.

In some embodiments, the acoustic waves of the laterally vibrating mode are to propagate through the piezoelectric thin-film with different delay times that are proportional to distances between each opposing pair of the second interdigitated electrodes and the respective opposing pair of the first interdigitated electrodes of equal pitch. A phase velocity of the acoustic waves of different frequencies have an identical phase velocity.

In embodiments, the passive voltage gain device includes a cavity disposed between the piezoelectric thin-film and the carrier substrate. The cavity can include any gas (e.g., inert gas) or be in a vacuum. In some embodiments, the piezoelectric thin-film has electromechanical coupling coefficient ($k_t^2$) greater than 10 percent.

FIG. 1 illustrates a low power wake-up radio that implements a passive voltage gain device, according to embodiments of the present disclosure. In some embodiments, the wake-up radio 100 can include a component-chain formed by a receiving antenna 105, a passive voltage gain device 110 (also referred to as a "passive gain module" herein), a rectifier 115, a comparator 120, and a correlator 125 (e.g., digital correlator). In some embodiments, the wake-up radio 100 can be connected to another device, such as an IoT node 130. In some embodiments, the passive voltage gain device 110 can convert the input electrical signal 135 (also referred to as "wake-up signal" herein) into a compressed pulse 140. In some embodiments, the passive voltage gain device 110 provides a voltage boost to the input of the rectifier 115 (e.g., compressed pulse 140) to facilitate the detection of the signal envelope. In embodiments, the signal processing beyond the rectifier 115 is done in the digital domain. The incoming wake-up signal 135, in general formed by a sequence of RF pulses, is converted into a train of digital pulses (e.g., digital signal 145) by the rectifier-comparator portion of wake-up radio 100. The signal train (e.g., digital signal 145) is correlated at correlator 125 with a stored code to decide if the correct wake-up signal has been received. This allows the wake-up radio 100 to distinguish the wake-up signal from noise out of the components in the signal chain and interference in the RF ambiance.

In some embodiments, two factors help achieve ultra-low sensitivity while maintaining a low false alarm rate: the responsivity to low voltage levels, and the ability to discern the wake-up signal 135 from the noise floor. The former factor is mainly given by the threshold voltage of the semiconductor-based rectifier. As the rectifier 115 may present a strong non-linear characteristic, the voltage delivered to the comparator 120 decays dramatically for sub-threshold voltage levels at the rectifier input. Regardless of the rectification gain, the sensitivity of the wake-up radio 100 can be further compensated by setting the detection threshold of the comparator 120. In principle, the lower the comparator threshold, the lower the sensitivity. Nonetheless, as the comparator threshold approaches the noise level, the comparator 120 can falsely be triggered upon noise spikes, increasing the false alarm rate and compromising the wake-up radio 100 performance. Although digital correlation can help to mitigate the false alarm rate, it comes at the expense of extra power consumption. For this reason, the signal to noise ratio (SNR) can establish the ultimate limit of performance, and may be enhanced wherever possible in the wake-up radio 100.

In some embodiments, in addition to the wake-up radio 100 in FIG. 1, alternative systems based on (Micro-Electro- Mechanical systems) MEMS switches can also be used to simultaneously work as rectifier and comparator. In some embodiments, MEMS switches can provide improved sub-threshold swing than semiconductor counterparts. Although MEMS switches can have higher threshold voltages than semiconductor-based rectifier, some MEMS switches have lower the actuation voltage using either offset control, or a dynamic waveform that resonantly actuates the switch.

As discussed above, the voltage level at the rectifier input is one of the challenges to overcome for improving the sensitivity. Some approaches have been reported to achieve passive voltage gain based on impedance transformation. Such approaches rely on either lumped components, or piezoelectric MEMS transformers. The former approach is mostly effective at low frequencies (<100 MHz) because a large inductor with high quality factor (Q) can be used to tune out the input capacitance of the rectifier (Crec). Provided a high Q, the resonant tuning can leave behind a sufficiently large residue shunt resistance ($R=Q/(\omega C_{rec})$) that supports high impedance transformation. Unless a very high Q inductor is accessible, the residue shunt resistance limits the voltage gain as the frequency scales up, and prevents reducing the antenna size in the wake-up radio 100 for form-factor-constraint applications. Alternatively, a MEM two-port resonator with a much higher Q can be utilized as an impedance transformer. The device figure of merit (FoM), given by the product of the electromechanical coupling and ($k_t^2$) and Q, determines the voltage gain in such an approach. Therefore, past approaches have resorted to high FoM modes in various piezoelectric materials. Regardless of the material in use, the high impedance transformation ratio typically results in a small static output capacitance, which makes the transformer voltage gain very sensitive to the capacitive loading at the output and the presence of spurious modes.

In some embodiments, the passive voltage gain device 110 is an acoustic chirp compressor. The wake-up signal 135 can be in the form of pulses coded with linear chirps to achieve instantaneous voltage gain. The chirp compressor, also known as a matched filter, turns the wake-up signal 135 into a train of magnitude-amplified and duration-shorten pulses (e.g., compressed pulse). If implemented with a high processing gain given by the product of the chirp bandwidth (B) and duration (T), the chirp compressor can drastically enhance the signal-to-noise ratio (SNR). In other words, the wake-up radio 100 implementing a chirp compressor can achieve the analog correlation in the front end to compliment and, in certain cases, relax the performance requirements or need for the digital correlation. The wake-up radio 100 implementing a chirp compressor can further lower the power consumption by reducing the power budget for digital correlation, while maintaining or even improving the sensitivity of the system. Additionally, in contrast to an impedance-transformation-only approach, the chirp compressor, which does can be used without a low output capacitance and high output impedance to attain a high voltage gain, can more favorably interface a low input impedance rectifier, and provide more tolerance to capacitive loading. Finally, differently from lumped elements, the center frequency of the chirp compressor is readily scalable from 100 MHz to GHz, thus permitting higher carrier frequencies and smaller antennas for the receivers.

Analog chirp compression has been used in past approaches for enhancing SNR in radar systems, and implementing spread-spectrum communication schemes. In some of the past approaches, other chirp compressors relied on surface acoustic waves (SAW)-based dispersive delay lines. The main drawbacks of these devices are their high insertion loss (IL) due to electrode-induced scattering, and their moderate fractional bandwidth limited by impedance match at the input and output. The former originates from the SAW device structures and is intrinsically difficult to avoid. The latter results from the limited electromechanical coupling ($k_t^2$) of SAW, which restricts the fractional bandwidth (FBW) of the chirp signal, and thus the processing gain. Because of these drawbacks, SAW devices typically present an instantaneous voltage gain of less than unity, consequently compromising their applicability for the above-described low power wake-up radios.

In some embodiments, the passive voltage gain device 110 can include a piezoelectric thin-film that can be used to transmit acoustic waves in a laterally vibrating modes, such as shear-horizontal (SH0), length extensional (S0) types, a first order thickness extensional (S1) types, or a thickness shear (A1) types. In embodiments, the piezoelectric thin-film can be suspended single-crystal lithium niobate (LiNbO3) or lithium tantalate (LiTaO3) thin films. The particular materials used for the piezoelectric thin-film are provided for illustration, rather than limitation. In other embodiments, the piezoelectric thin-film can include Aluminum Nitride (AlN), Scandium doped Aluminum Nitride (AlN), Potassium Niobate (KNbO3), and Potassium Tantalite (KTaO3). In some embodiments, the piezoelectric thin-film can be enabled by various film transfer techniques. High $k^2$ (>25%) and large FBW can be achieved in resonators and filters of various configurations due to the pronounced piezoelectricity of single crystal LiNbO3. Furthermore, the suspended piezoelectric thin-film can confine the acoustic waves, eliminating the electrode-induced scattering into the substrate and minimizing the propagation loss. In some embodiments, leveraging both features, passive voltage gain devices 110 can be designed, fabricated, and characterized as chirp compressors based on one or both SH0 and S0 modes in an piezoelectric thin-film, such as X-cut LiNbO3 thin film. In other embodiments, the chirp compressors can be based on one or both SH0 and S0 modes in one of X-cut, Z-cut, Y-cut, or rotated X, Y, Z-cut LiNbO3 thin film or X-cut, Z-cut, Y-cut, or rotated X, Y, or Z-cut lithium tantalate thin-film. In some embodiments, piezoelectric thin-film includes one of X-cut, Z-cut, Y-cut, rotated X-cut, rotated Z-cut, or rotated Y-cut piezoelectric thin-film that includes one of lithium niobate thin-film (LiNbO3), lithium tantalate thin-film (LiTaO3), potassium niobate thin-film (KNbO3), or potassium tantalite thin-film (KTaO3). In some embodiments, the piezoelectric thin-film includes c-axis grown aluminum nitride thin-film (AlN) or c-axis grown scandium doped aluminum nitride thin-film (AlN).

In some embodiments, a chirp compressor as described herein demonstrates an IL of 10 dB, a FBW of 50%, and a differential delay of 833 ns. Although this performance is demonstrated at a center frequency of 240 MHz, the chirp compressor can be scaled-up to GHz frequency range, by taking advantage of state-of-the-art high resolution lithography techniques such as e-beam. The improvement of the SNR has also been characterized, showing values larger than the theoretical minimum of 100. Time-domain measurements show that, thanks to the high processing gain and low IL achieved, an instantaneous voltage gain larger than one is obtained, never demonstrated before for passive chirp compressors. As discussed above, the SNR enhancement and simultaneous voltage gain can be exploited to improve the sensitivity of near zero power wake-up radios.

Figure 2:
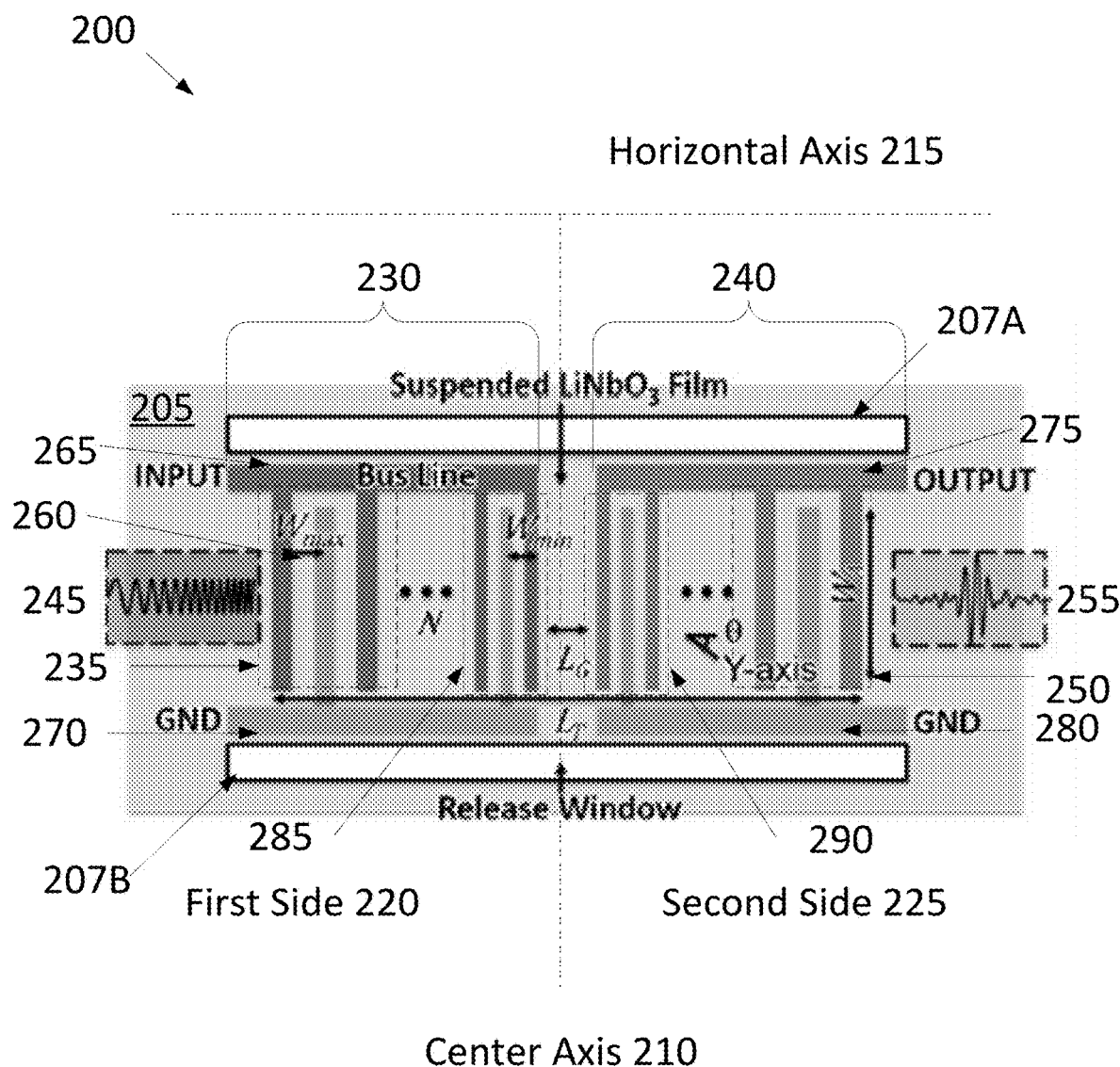
FIG. 2 illustrates a passive voltage gain device, according to embodiments of the present disclosure.

FIG. 2 illustrates a passive voltage gain device, according to embodiments of the present disclosure. In embodiments, the passive voltage gain device 200 includes a piezoelectric thin-film 205 suspended above a carrier substrate. The carrier substrate, in one embodiment, is the silicon (Si) layer discussed with reference to FIG. 10 by way of example. The piezoelectric thin-film 205 has a horizontal axis 215 orientated along a length of the piezoelectric thin-film 205 and a center axis 210 orientated along a width of the piezoelectric thin-film 205. The horizontal axis 215 is perpendicular to the center axis 210. The piezoelectric thin-film 205 includes a first side 220 and a second side 225 with respect to the center axis 210.

The passive voltage gain device 200 includes an input interdigital transducer (IDT) 230 that includes first interdigitated electrodes (e.g., such as opposing pair interdigitated electrodes 235) disposed at different locations along the horizontal axis 215 and on the first side 220 of the piezoelectric thin-film 205. Each opposing pair of the first interdigitated electrodes (e.g., electrodes 235) is to selectively transduce a particular frequency range of an input electrical signal 245 that varies in frequency over time into an acoustic wave of a laterally vibrating mode based on a pitch 260 (W) between electrodes of the opposing pair 235.

The passive voltage gain device 200 includes an output IDT 240 that includes second interdigitated electrodes (e.g., electrodes 250) disposed at different locations along the horizontal axis 215 and on the second side 225 of the piezoelectric thin-film 205. Each opposing pair (e.g., electrodes 250) of the second interdigitated electrodes corresponds to a respective opposing pair (e.g., electrodes 235) of the first interdigitated electrodes of equal pitch 260. Each opposing pair (e.g., electrodes 250) of the second interdigitated electrodes is to convert the acoustic wave transduced by the respective opposing pair (e.g., electrodes 235) of the first interdigitated electrodes into a compressed pulse 255.

In some embodiments, the compressed pulse 255 has the same spectral content as the input electrical signal 245. The passive voltage gain device 200 delays the different frequency ranges transduced by corresponding respective opposing pairs of interdigitated electrodes of the input IDT 230. The different frequency ranges interfere at the output IDT 240 to form the compressed pulse 255. The different frequency ranges are received at different moments in time at the input IDT 230, and the different frequency ranges are delayed differently based on the distance between a respective opposing pair of interdigitated electrodes of the input IDT 230 and the corresponding opposing pair of interdigitated electrodes of the output IDT 240. The different frequency ranges (e.g., all the frequency components) arrive and add up at the output IDT 240 concurrently or at the identical moment in time.

In some embodiments, the piezoelectric thin-film 205 may not have strong dispersion. Since the acoustic waves of different frequencies are transmitted in a laterally vibrating mode, the acoustic waves of a particular mode can travel at the identical velocity through the wave guiding structure of the piezoelectric thin-film 205. The transducer layout can be used to generate a dispersive delay. For example, the distance between respective opposing pairs of interdigitated electrodes of the input IDT 230 and corresponding opposing pairs of interdigitated electrodes of the output IDT 240 can cause a particular delay based on distance (L) and dispersion of the acoustic waves.

In some embodiments, a first electrode (e.g. first electrode farthest to the left) of a first opposing pair (e.g., electrodes 355) of the first interdigitated electrodes is coupled to an input bus line 265. A second electrode (e.g., second electrode farthest to left) of the first opposing pair (e.g., electrodes 355) of the first interdigitated electrodes is coupled to an input ground line 270. A third electrode (e.g. last electrode farthest to the right) of a first corresponding opposing pair (e.g., electrodes 250) of the second interdigitated electrodes is coupled to an output bus line 275. A fourth electrode (e.g. second to last electrode farthest to the right) of the first corresponding opposing pair (e.g., electrodes 250) of the second interdigitated electrodes is coupled to an output ground line 280. In some embodiments, input ground line 270 and output ground line 280 can be coupled to the same or different ground voltage potential.

In some embodiments, the input IDT 230 and the output IDT 240 are symmetric about the center axis 210. A first opposing pair (e.g., electrodes 285) of the first interdigitated electrodes that is nearest to the center axis 210 has an equal pitch (W) and is located an identical distance from the center axis 210 as a corresponding first opposing pair (e.g., electrodes 290) of the second interdigitated electrodes that is nearest to the center axis 210. A second opposing pair (e.g., electrodes 235) of the first interdigitated electrodes that is farthest from the center axis 210 has an equal pitch (W) and is located an identical distance from the center axis 210 as a corresponding second opposing pair (e.g., electrodes 250) of the second interdigitated electrodes that is farthest from the center axis 210. In some embodiments, the pitches (W) of opposing pairs of the first interdigitated electrodes vary along the horizontal axis. For example, the pitch (W) of opposing pairs 235 of first interdigitated electrodes is larger than the pitch (W) of opposing pairs 285 of first interdigitated electrodes.

In some embodiments, the acoustic waves of the laterally vibrating mode are to propagate through the piezoelectric thin-film 205 with different delay times that are proportional to distances (L) between each opposing pair (e.g., electrodes 250) of the second interdigitated electrodes and the respective opposing pair (e.g., electrodes 235) of the first interdigitated electrodes of equal pitch (W). The phase velocity $(v_p)$ of the acoustic waves of different frequencies have the identical phase velocity $(v_p)$.

In some embodiments, the input electrical signal 245 received at the input IDT 230 is an input chirp signal with a bandwidth (B) and a duration (T) that varies in frequency over time. The frequency components of the input chirp signal are collected at the output IDT 240 concurrently to form the compressed pulse 255. The power of the input chirp signal is condensed resulting in an instantaneous power amplification of a time-bandwidth (TB) product to signal.

It can be noted that each of the input IDT 230 and output IDT 240 can be composed of multiple IDTs, where each of the pairs of opposing pairs of interdigitated electrodes can be considered a transducer that transduces an electromagnetic or acoustic wave in a particular frequency range. In some embodiments, the acoustic waves are facilitated by the input IDT 230 and the output IDT 240 being suspended above the piezoelectric thin-film 205. In these embodiments, a pair of release windows 207A and 207B are respectively formed on either side of the input IDT 230 and the output IDT 240 with respect to the horizontal axis 215 (see operation 1025 of FIG. 10). As will be discussed, the release windows 207A and 207B may be accessed (or used) to form a release area that, in some embodiments, is a cavity formed between the piezoelectric thin-film 205 and the carrier substrate, e.g., the Si layer (see operation 1030 of FIG. 10).

In some embodiments, the acoustic wave travels within the piezoelectric thin-film 205 in at least one of a shear-horizontal (SH0) laterally vibrating mode or a length extensional (S0) laterally vibrating mode. In some embodiments, piezoelectric thin-film 205 is one of lithium niobate thin-film or lithium tantalate thin-film. In embodiments, the piezoelectric thin-film 205 is one of an X-cut, Z-cut, Y-cut, or rotated X, Y, or Z-cut lithium niobate thin-film or lithium tantalate thin-film. In other embodiments, different materials can be used. In some embodiments, lithium niobate thin-film or lithium tantalate thin-film with different cuts can be used.

In embodiments, the passive voltage gain device 200 is an acoustic chirp compressor. Acoustic chirp compressors are based on delay-line structures, in which electromagnetic (EM) waves are transduced into the mechanical domain (e.g., acoustic waves), and dispersively delayed before they are converted back into the EM domain. Attaining delays at RF in the EM domain may require prohibitively long and bulky devices. Acoustic waves, with phase velocities ($v_p$) in the order of thousands of m/s, are suitable for such function in size-constrained applications. In this context, a delay line is a two-port device formed by two interdigital transducers (IDTs), such as an input IDT 230 and an output IDT 240, on a piezoelectric thin-film 205. The acoustic wave is generated at the input IDT 230 and, after propagating between both IDTs, it is picked up by the output IDT 240. The piezoelectric conversion of this kind of transducer is frequency-selective, with the center frequency determined by the electrode pitch (W) 260. Electrode pitch for an opposing pair of interdigitated electrodes is the distance from the center of the outer electrode to the center of the adjacent electrode (e.g., center electrode). The center frequency determined by electrode pitch (W) is:

$$f = \frac{v_p}{2W} \qquad (1)$$

In embodiments, by linear-sweeping the electrode pitch along the longitudinal direction of the IDTs, and arranging them symmetrically, a double-dispersive response can be obtained. In other words, the time delay is a linear function of the frequency. The dispersion occurs in the electrode configuration because the input and output IDT pairs for higher frequencies ($W_{min}$) are located closer than those for lower frequencies ($W_{max}$). The device bandwidth, roughly set by the transducers for the highest and lowest frequencies in the chirp, can be expressed as:

$$B = f\max - f\min = \frac{v_p}{2}\left(\frac{1}{W_{min}} - \frac{1}{W_{max}}\right) \qquad (2)$$

The differential delay, T, namely the time delay at $f_{min}$ minus the time delay at $f_{max}$, is determined by the total length covered by the IDTs:

$$T = \frac{L_T - L_G}{v_p}. \qquad (3)$$

If an up-frequency chirp signal with a bandwidth B and duration T is sent to the input IDT 230, all the frequencies are collected at the output IDT 240 at the same time due to the dispersive delays, consequently forming a compressed pulse 255. The power of the chirp signal is condensed over a short duration, resulting in an instantaneous power amplification of time-bandwidth product (TB) to the signal.

Figure 3A:
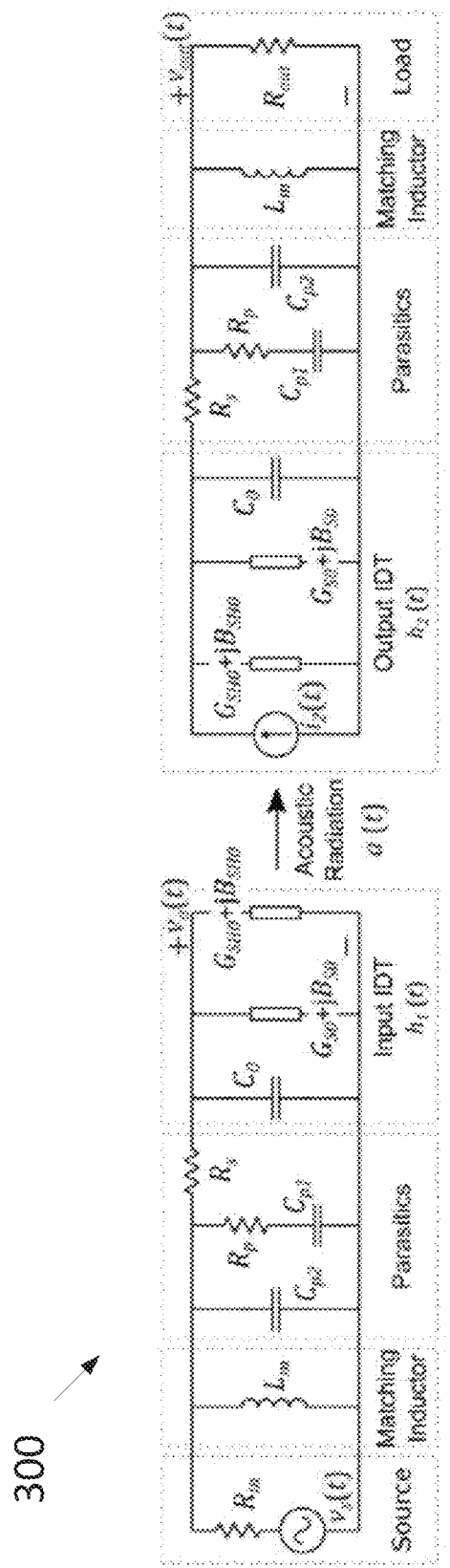
FIG. 3A illustrates a circuit model of a passive voltage gain device, according to embodiments of the present disclosure.

FIG. 3A illustrates a circuit model of a passive voltage gain device, according to embodiments of the present disclosure. In some embodiments, an analytical approximation to the response of an acoustic delay line with arbitrary IDT configuration can be provided using the impulse model. The input and output IDTs are described by their impulse response h(t), i.e. the time-domain acoustic waves generated with a unitary impulse voltage. The impulse response can be approximated as a sinusoid of frequency given by equation (1). In the case of dispersive transducers, h(t) takes the form of a chirp. Defining $f_i$ as the center frequency of the transducer at a distance of $tv_p$ from the IDT edge in the center section of the delay line, h(t) can be formulated as:

$$h(t) = 4\sqrt{k^2 C_s f_i^3(t)} \sin(2\pi \int_0^t f_i(\tau)d\tau) \qquad (4)$$

Since $f_i$ varies linearly across the transducer, the inverse of the pitch does likewise. The amplitude in equation (4) is determined by the static capacitance per electrode pair in the transducer, $C_s$, the electromechanical coupling, $k^2$, and $f_i$. For symmetrically-arranged double dispersive IDTs, impulse responses are identical with a duration of T/2. The acoustic wave excited by an arbitrary voltage $v_a(t)$ applied to the input IDT can be obtained by convolution as:

$$a(t) = v_a(t) * h_1(t). \qquad (5)$$

In the above, a(t) represents the acoustic wave launched towards the output IDT. Due to the bi-directional nature of the IDTs, another wave with the same power is radiated to the opposite direction and lost into the substrate. It is worth noting that, whilst $k^2$ and $C_s$ depend on the ratio of the electrode pitch (W) to the film thickness, they are approximated as constants that represent average values. Assuming this approximation, a lumped element model (i.e., circuit model 300) can be constructed. The radiation conductance, which captures the power radiation from each transducer, can be deduced from energy conservation as:

$$G(\omega) = 2|H(\omega)|_2 \qquad (6)$$

H(ω) represents the Fourier transform of h(t). The factor of 2 in equation (6) arises from the aforementioned bi-directionality. The radiation susceptance, B(ω), can be obtained as the Hilbert transform of G(ω). Both IDTs are modeled as two separate acoustic admittances in parallel, representing the S0 and SH0 wave modes. The total static capacitance of each IDT with N electrode pairs is $C_0 = NC_s$. The received acoustic wave at the output IDT is modeled as a current source. The total attenuation in wave propagation from the input to the output is accounted by a loss factor, γ, in decibels (dB). The current is given by reciprocity of the device as:

$$i_2 = 2 \cdot h_2(t) * a(t) \cdot 10^{-\gamma/20} \qquad (7)$$

The circuit model 300 shows that at least half of the power received at the output IDT will be re-radiated by the radiation conductances $G_{S0}$ and $G_{SH0}$. Parasitic elements are added at the input and output IDTs, accounting for the ohmic resistance of the bus lines ($R_s$), the capacitances due to bus lines and probing pads ($C_{P1}$ and $C_{P2}$), and the leakage resistance of the substrate ($R_P$).

From equations (4-7), it can be concluded that the maximum compression can be achieved if the combined impulse response of both transducers matches the time reversal of the input voltage:

$$h_{12}(t) = h_1(t) * h_2(t) = c_0 v_a(t_0 - t) \qquad (8)$$

$i_2(t)$ is then the delayed autocorrelation function of $v_a(t)$. Regardless of various sources of power loss, the input chirp signal is compressed by a factor of TB. By applying energy conservation, the compressed pulse has a duration of 1/B. Note that the compression is only applied to signals correlated to the device response $h_{12}(t)$. As noise is random, it is not correlated. Consequently, the SNR is enhanced approximately by TB.

In embodiments, besides the processing gain TB, a low IL is desirable to prevent significant attenuation of the input signal. Unfortunately, delay lines formed by bi-directional transducers can suffer from the intrinsic limitation that at least ½ of the input power is inevitably lost at the input IDT, and another ¼ at the output IDT. As a result, only ¼ can be recovered at the output at best. In other words, the minimum achievable IL is 6 dB with a chirp compressor that uses double dispersive and symmetrically arranged input and output transducers. It is still challenging to construct unidirectional chirp transducers to reduce the loss from bi-directionality. This is because unidirectional transducers, which typically rely on distributed reflectors embedded among transducers to establish transduction in one direction, are only effective over the narrow FBW of the reflectors. Due to the large FBW of the chirp signal, the chirp compressor can implement an apparatus for reflection.

Apart from the loss due to bi-directionality, other notable causes of IL are: propagation loss, basically limited by the material and type of wave exploited; Joule effect dissipation in the metal lines and electrodes; and impedance mismatch at input and output ports. If the parasitic effects are neglected, the latter can be minimized with a transducer design that satisfies:

$$G(\omega_0) = \frac{1}{R_{in}} = \frac{1}{R_{out}}, \qquad (9)$$

$R_{in}$ and $R_{out}$ are the source and load impedances, respectively, and $\omega_0$ is the center frequency of the IDTs. Given the length and bandwidth of a design, the acoustic aperture $W_A$ provides an additional degree of freedom to achieve a radiation resistance close to 50Ω at both IDTs for impedance matching purposes. In addition, shunt inductors ($L_m$) can be used at both ports to tune out the static capacitances $C_{01}$ and $C_{02}$ at $\omega_0$. The radiation susceptance can be neglected for impedance matching as it is typically insignificant relative to G and $C_0$, and B ($\omega$0)=0. Note that impedance matching with passive components may be attained over certain frequency ranges. The quality factor of the IDTs is given by Q=$\omega C_0$/G. Inductive matching is possible as long as Q is less than the reciprocal of the FBW. This fact establishes the maximum bandwidth that can be tolerated to achieve a matching condition over the operation bandwidth. The FBW limit is:

$$FBW_{max} = \sqrt{\frac{4k^2}{\pi}} \qquad (10)$$

The instantaneous voltage gain $g_v$, defined as the maximum amplitude of the compressed wave $v_{out}$ divided by the amplitude of the input wave $v_s$, is determined by the combination of the TB product and the overall IL. Considering an average value for the IL over the transmission bandwidth:

$$g_v = \sqrt{\frac{TB}{10^{IL/10}} \cdot \frac{R_{out}}{R_{in}}} \qquad (11)$$

In some embodiments, the chirp compressors can be designed in multiple orientations, such as −10° and +30° with respect to Y-axis in the X-cut plane of $LiNbO_3$, to maximize the transduction of SH0 and S0, respectively. For a film stack composed of 800 nm-thick $LiNbO_3$/300 nm-thick $SiO_2$, the phase velocities were calculated for the free ($v_\infty$) and short-circuit ($v_0$) boundary conditions on the top surface for selected wave modes and material orientations. The corresponding electromechanical coupling is also derived as:

$$k^2 = 2\left(1 + (\epsilon_{11}\epsilon_{33} - \epsilon_{13}^2)^{-\frac{1}{2}}\right)\frac{v_\infty - v_0}{v_0} \qquad (12)$$

Figure 3B:
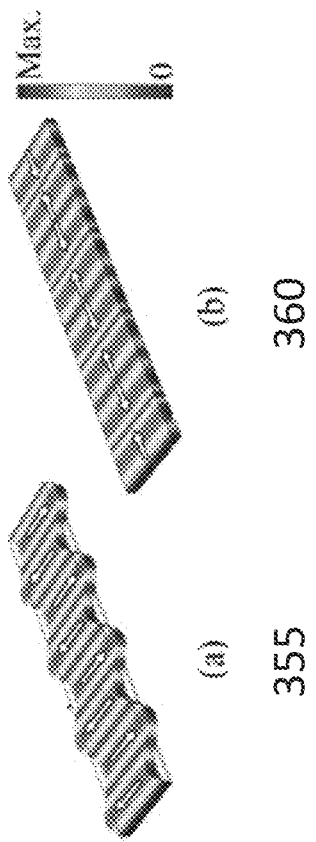
FIG. 3B shows a visualization of the propagating displacement waves for both SH0 mode and S0 mode, in accordance with embodiments of the disclosure.

$\epsilon_{11}$, $\epsilon_{33}$, and $\epsilon_{13}$ are components of the relative permittivity tensor under constant stress for $LiNbO_3$, with 1 denoting the direction of wave propagation and 3 denoting the direction normal to the surface. Table 1 lists the calculated values of the phase velocity as well as the electromechanical coupling. FIG. 3B shows a visualization of the propagating displacement waves for both SH0 mode 355 and S0 mode 360, in accordance with embodiments of the disclosure.

TABLE 1

| | θ = −10° | | | θ = +30° | | |
| --- | --- | --- | --- | --- | --- | --- |
| Mode | $v_\infty$ | $v_0$ | $k^2$ | $v_\infty$ | $v_0$ | $k^2$ |
| SH0 | 4370 m/s | 3617 m/s | 42.1% | 3961 m/s | 3920 m/s | 2.1% |
| S0 | 6462 m/s | 6357 m/s | 3.3% | 7018 m/s | 6047 m/s | 32.5% |

Returning to FIG. 3A, the experimental bandwidth and differential time delay are anticipated to slightly deviate from the design values predicted by equation (2) and equation (3). The cause for this is that the actual phase velocities might exhibit slight mismatch from the calculated values due to the residual stress in the released thin film. Nevertheless, the TB product and FBW are exclusively dependent on the geometry of the transducers, which can be set by lithography:

$$TB = \frac{L_T - L_G}{2}\left(\frac{1}{W_{min}} - \frac{1}{W_{max}}\right) \qquad (13)$$

$$FBW = 2\left(\frac{W_{max} - W_{min}}{W_{max} + W_{min}}\right) \qquad (14)$$

The number of electrode pairs per IDT can be calculated as N=T B/(2·FBW). The varying dimensions of the devices implemented are summarized in Table 2, along with their corresponding TB, FBW, and N.

TABLE 2

| | Device | | | | |
|---|---|---|---|---|---|
| | A | B | C | D | E |
| θ | −10° | −10° | −10° | +30° | +30° |
| Target mode | SH0 | SH0 | SH0 | S0 | S0 |
| $W_{min}$ (μm) | 6 | 10 | 6 | 6 | 10 |
| $W_{max}$ (μm) | 10 | 16.7 | 10 | 10 | 16.67 |
| $L_T - L_G$ (mm) | 1 | 1 | 3 | 2 | 2 |
| N | 33 | 20 | 100 | 67 | 40 |
| $W_A$ (μm) | 200 | 200 | 200 | 200 | 500 |
| TB | 33 | 20 | 100 | 67 | 40 |
| FBW (%) | 50 | 50 | 50 | 50 | 50 |
| | Predicted from FEA Simulations | | | | |
| $f$(MHz) | 181-301 | 109-181 | 181-301 | 302-504 | 181-302 |
| T (ns) | 276 | 276 | 829 | 331 | 331 |

The expected frequency bands and differential time delays were calculated, based on the simulated phase velocities with the short-circuit condition for both modes at their selected orientations. Two different sets of minimum and maximum pitch values were chosen to test different frequency bands, with a FBW of 50% in both cases. The total length of the chirp compressor was swept from 1 to 3 mm for enabling various delays and characterizing the propagation loss. The ratio of the electrode width to the transducer pitch is set to 0.5 for all cases. The width of bus lines and $L_G$ are set to 70 and 100 μm respectively.

Figure 3C:
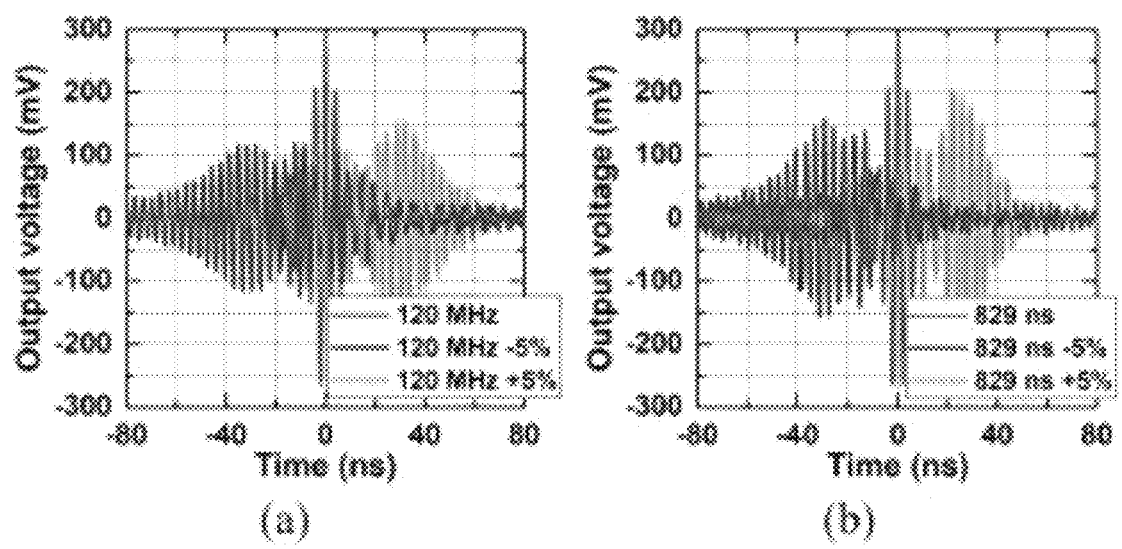
FIG. 3C illustrates a calculated response of device C (of Table 2) for a matched signal with amplitude of 100 mV compared to the response ±5% variation in (a) bandwidth and (b) duration, in accordance with embodiments of the disclosure.

FIG. 3C illustrates a calculated response of device C (of Table 2) for a matched signal with amplitude of 100 mV compared to the response ±5% variation in (a) bandwidth and (b) duration, in accordance with embodiments of the disclosure. As an example, the calculated response of Device C, for $R_{in}=R_{out}=50\Omega$ and without considering propagation loss as illustrated in FIG. 3C. The chirp compressor's response to a matched input chirp with a frequency span of 181-301 MHz, T=829 ns, and an amplitude of 100 mV is compared to its responses to input chirps with ±5% offset from matched B and T conditions, and the same center frequency.

Figure 3D:
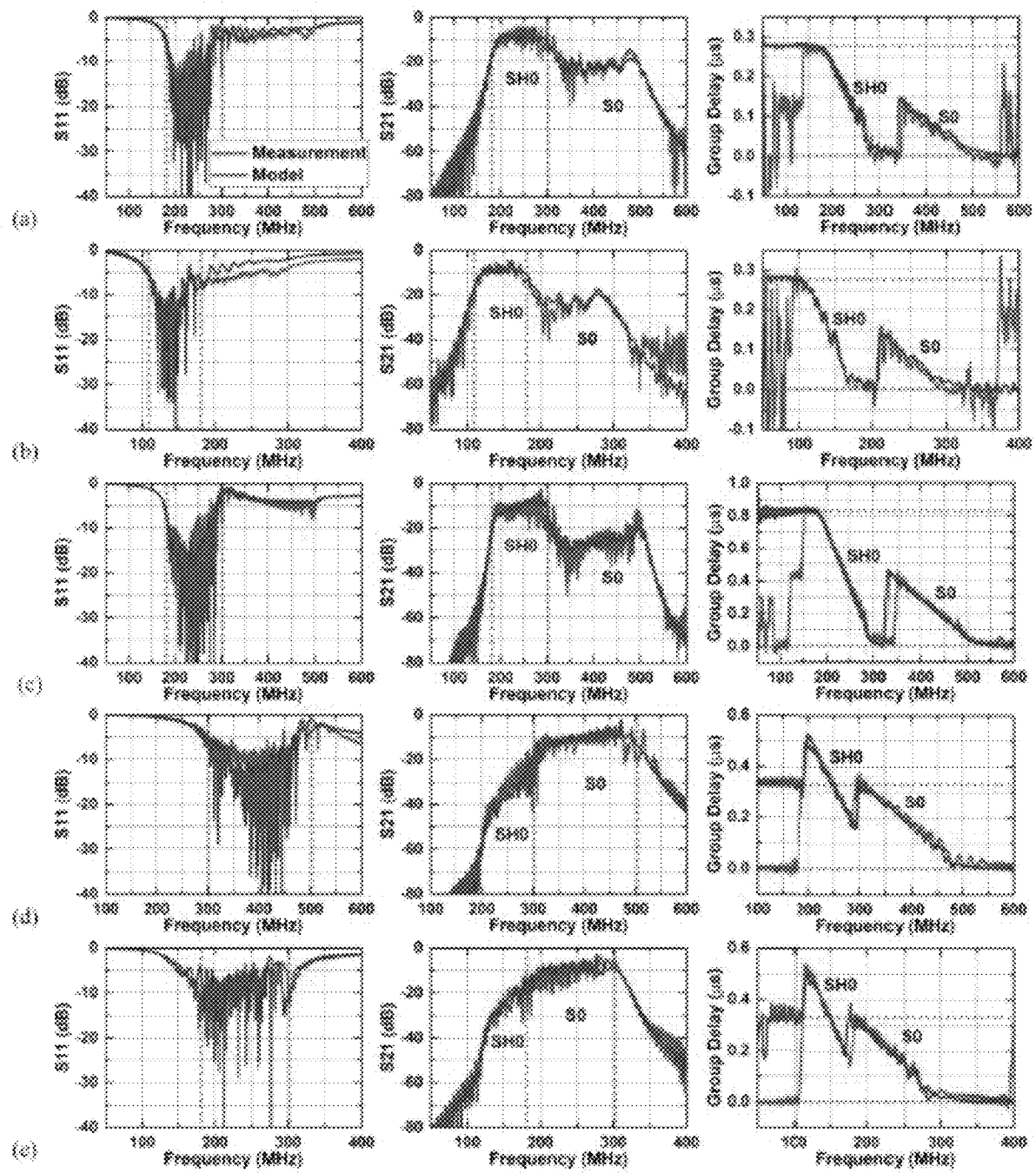
FIG. 3D illustrates the measured S-parameters and group delays of the fabricated devices with matched ports, in accordance with embodiments of the disclosure.

FIG. 3D illustrates the measured S-parameters and group delays of the fabricated devices with matched ports, in accordance with embodiments of the disclosure. The frequency domain responses of the five fabricated devices were characterized with S-parameter measurements. The measurements were done with a Keysight PNA-X N5249A™ network analyzer directly connected, substituting source and load in FIG. 3A, without matching inductors. The matched responses were then obtained by importing the measured data into ADS and introducing matching inductors, with an assumed quality factor of 50, and various real port impedances at the input and output. The required values of Lm, Rin and Rout to attain impedance matching for each device are listed in Table III.

TABLE 3

| | Device | | | | |
|---|---|---|---|---|---|
| | A | B | C | D | E |
| $R_{in}, R_{out}$ (Ω) | 580 | 1450 | 150 | 210 | 510 |
| $L_m$ (nH) | 265 | 1500 | 92 | 50 | 250 |

The resulting S-parameter performance is shown in FIG. 3D for each device. Both SH0 and S0 bands are observed in all devices. No dependence of the response on the input power was observed for power levels up to 0 dBm. As expected, the SH0 mode is dominant for Devices A, B, and C, while S0 is dominant for Devices D and E. A flat passband with an average IL of 10 dB is seen for all of them. The group delays of all devices are also plotted in FIG. 3D, by taking the derivative of the phase of S21 with respect to the frequency. Negative slopes are observed over both the SH0 and S0 bands, indicating the intended dispersive responses. The discrepancy observed between the modeled and measured group delays at the frequencies outside of the transmission bands is caused by the measurement uncertainty in phase, which results from the very high IL presented by the chirp compressors at these frequencies.

These measurement results match well with the predicted responses and implemented in simulation. To get the model curves in FIG. 3D, a consistent propagation loss was introduced in the calculation for all devices. The propagation loss, α (f), defined as the attenuation per propagation distance (dB/m), is formulated as proportional to the frequency by linear and quadratic terms:

$$a(f) = P_1 f + P_2 f^2 \quad (15)$$

The total loss incorporated in the model, y, is calculated by multiplying a(f) with the propagation distance from the input transducer to the output transducer, which is a linear function of frequency:

$$d(f) = L_G + (L_T - L_G)\frac{f_{max} - f}{B} \quad (16)$$

The extracted parameters for the propagation loss are listed in Table 4.

TABLE 4

| | θ = −10° (Devices A, B, and C) | | | θ = +30° (Devices D and E) | | |
|---|---|---|---|---|---|---|
| Mode | $v_p$ (m/s) | $k^2$ | $P_1$ (dB · s/m) | $v_p$ (m/s) | $k^2$ | $P_1$ (dB · s/m) |
| SH0 | 3600 | 39% | $8.3 \cdot 10^{-6}$ | 4000 | 2% | $7.5 \cdot 10^{-6}$ |
| S0 | 6250 | 2% | $4.8 \cdot 10^{-6}$ | 6000 | 30% | $5 \cdot 10^{-6}$ |

The comparisons between modeled and measured results are done using the same set of extracted parameters for capturing the propagation loss. The linear term P1 is found to the dominant one for these measurements. Thus the quadratic term P2 is neglected in (f).

The phase velocities, in Table 4, were extracted by matching the SH0 and S0 bands in the measurements with the modeled responses. Excellent agreement with the FEA simulations is found, resulting in the frequency bands centered close to the designed values, listed in Table 2 and denoted by dotted lines in FIG. 3D. Very high average values of k2 are extracted for SH0 and S0 modes at their optimal orientations, 39% and 30% respectively. The rest of the extracted parameters are listed in Table 5.

TABLE 5

| $C_s/W_A$ | $R_s$ | $R_p$ | $C_{p1}$ | $C_{p2}$ |
|---|---|---|---|---|
| 0.188 fF/μm | 20 Ω | 10 kΩ | 1.8 pF | 180 fF |

The static capacitance of the transducers, $C_0$, shows a linear relation to the acoustic aperture, $W_A$, and the number of electrode pairs, N. The parasitic elements, and specially $R_p$, are to reproduce the response out of the transmission bands. $R_p$ is caused by leakage currents between the connection pads, located at un-released areas of the LiNbO$_3$ thin film. The value obtained reflects a low resistivity of the carrier Si substrate.

Due to the large 2, it can be concluded from equation (10) that devices with a FBW up to 70% for SH0 and 62% for S0 can be achieved while maintaining the inductive matching. An overlapping band between SH0 and S0 bands can be seen for Devices D and E. This could cause the measured voltage gain to be less than the voltage gain predicted under the condition that band overlapping is absent. The reason is that part of the input power at the frequencies in the overlapping band of the S0 and SH0 bands will be radiated as both S0 and SH0 waves, with only one contributing to the chirp compression and processing gain. Such a gain degradation induced by band overlapping is quite moderate in this work as one mode is much more intensively excited than the other at either of the selected orientations. However, at other orientations, the consideration for avoiding band overlapping could set the limit on the maximum FBW of the device.

Time-domain measurements were carried out to validate the chirp compression. A Tektronix 70001A™ arbitrary wave generator (AWG) was employed to generate the input signal with Rin=50Ω. The response at the output of the chirp compressor was recorded by an Agilent MSO3104B oscilloscope with the input impedance configurable to either 50Ω or 1 MΩ. No tuning inductors were employed in the time domain measurements.

Figure 3E:
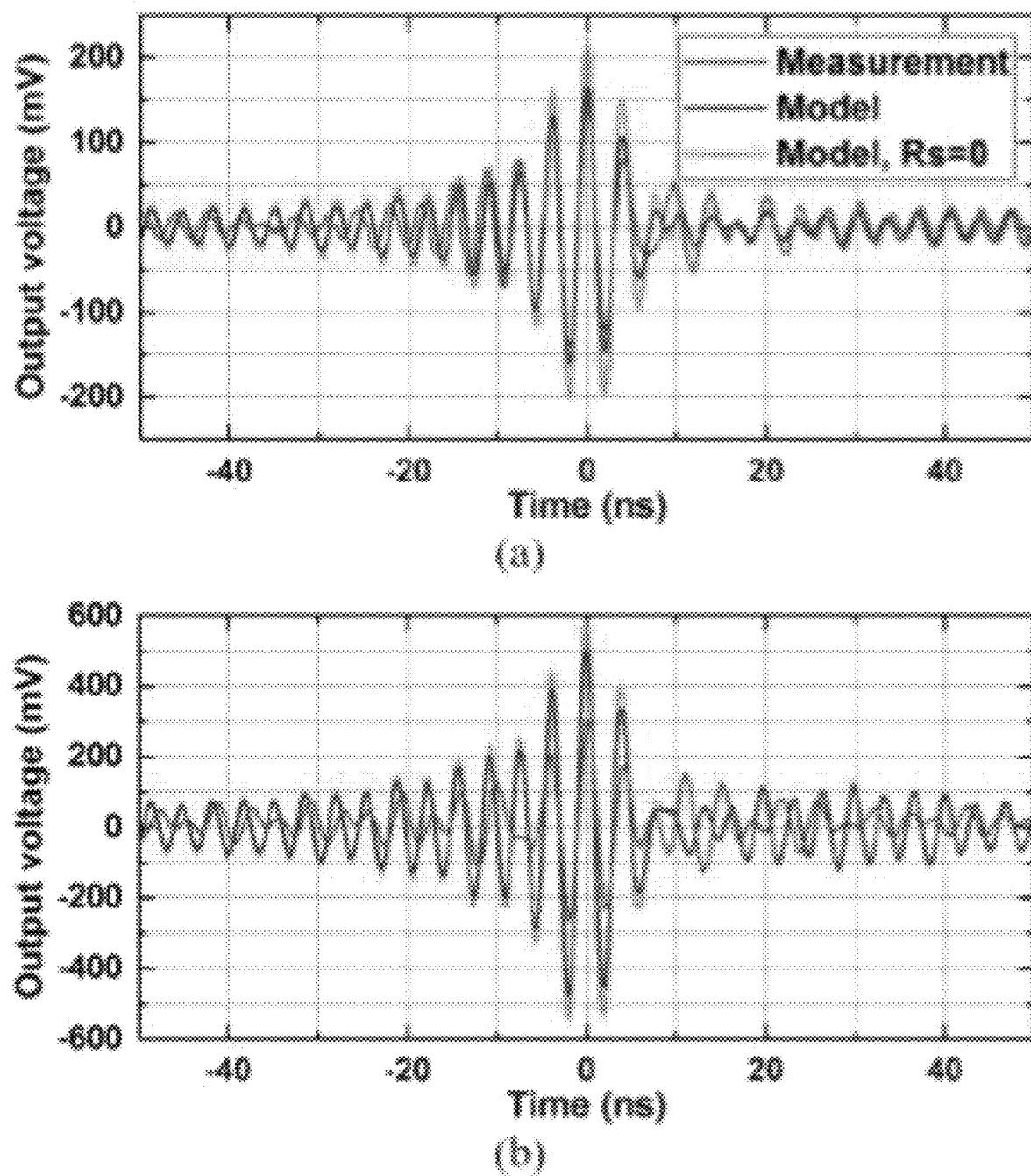
FIG. 3E illustrates output voltage measured and modeled for device C, in accordance with embodiments of the disclosure.

FIG. 3E illustrates output voltage measured and modeled for device C, in accordance with embodiments of the disclosure. FIG. 3E(a) shows the measured waveform at the output of Device C with $R_{out}$=50 Q, as the input is fed with a chirp of 100 mV in amplitude, 833 ns in duration, and a frequency range from 180 to 300 MHz. An instantaneous voltage gain of 1.5 is obtained, in good agreement with the time response predicted by the model. In addition, the model shows that the parasitic $R_p$, $C_{p1}$, and $C_{p2}$ have a negligible influence on the output waveform. This can be explained by the large size of the transducers, and its resulting large $C_0$. Nevertheless, the resistivity of the bus lines and electrodes has a noticeable effect. If $R_s$ is set to zero, the gain can be enhanced to be 30% higher. This leaves some room for improvement by increasing the Al thickness, if the second order effects caused by the additional mechanical loading can be avoided.

In order to maximize the output voltage, the response was also measured with a high impedance load. To do so, the input impedance of the oscilloscope was set to 1 MΩ. As seen in FIG. 3E(b), the output waveform reaches a maximum of 300 mV. This corresponds to a measured voltage gain of 3, which is less than the modeled gain of 5 as shown in FIG. 3E(b) and as expected for an ideal 1 MΩ load. Considering the model accurately predicted the performance for a 50 Q load with the loss parameters in Table IV, the discrepancy between the modeled and measured gains for a 1 MQ load is likely due to the load impedance presented by the oscilloscope. A characterization of the oscilloscope input impedance revealed a large susceptance at 300 MHz, causing a significant degradation in the recorded voltage amplitude at the output.

Figure 3F:
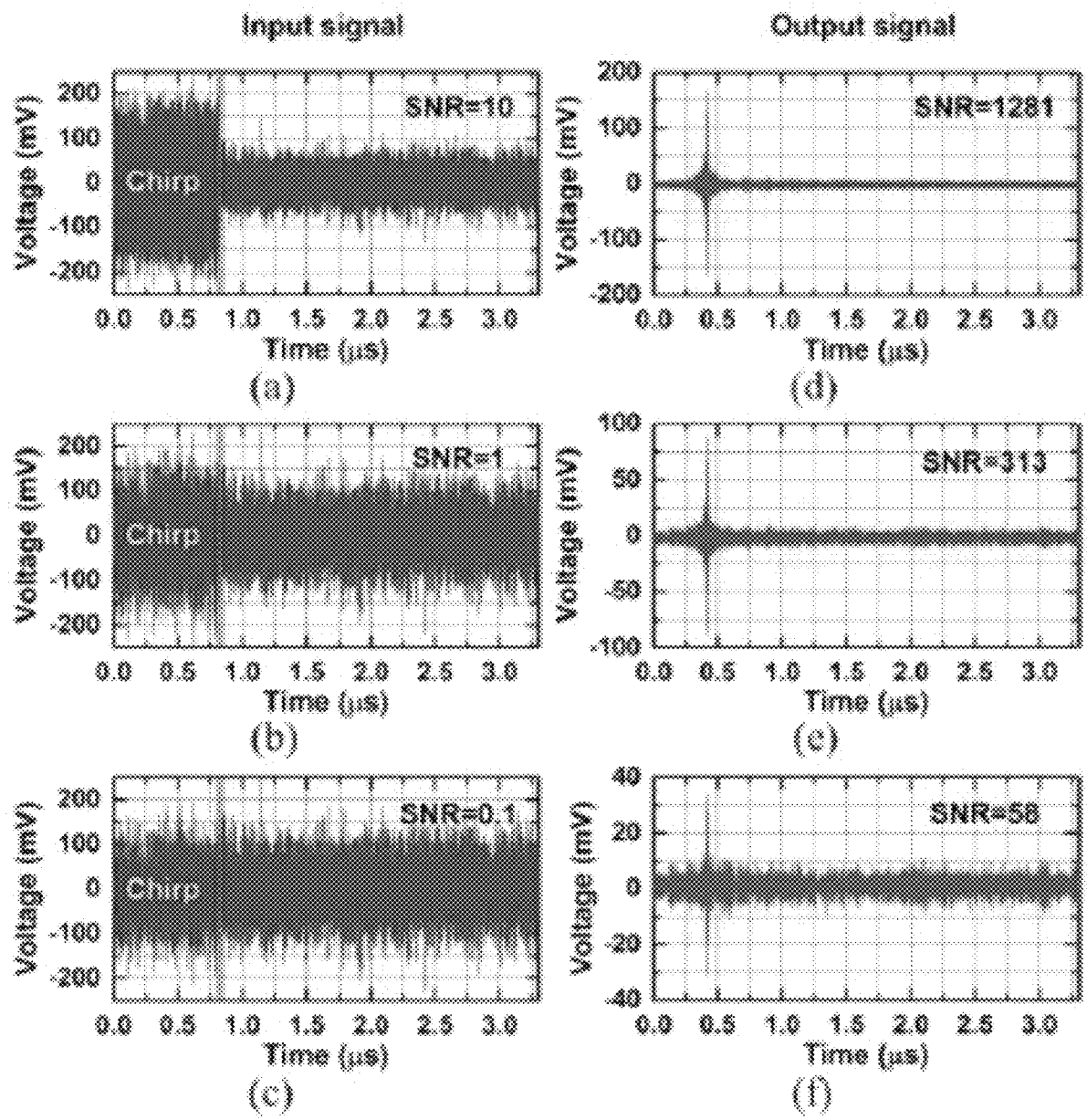
FIG. 3F shows the measured time-domain response of device C, in accordance with embodiments of the disclosure.

FIG. 3F shows the measured time-domain response of device C, in accordance with embodiments of the disclosure. Additional time-domain measurements were performed on Device C to evaluate the SNR enhancement. White Gaussian noise was generated in simulation with a sampling rate of 40 GSa/s. This signal was then low-pass filtered with a cut-off of 1 GHz, which is the bandwidth of the oscilloscope used in the measurements. The resulting noise was subsequently superimposed upon the designed chirp signal with a weighting factor to adjust the SNR to 10, 1, or 0.1. As seen in FIG. 3F(a-c), the chirps are only embedded at the beginning of the signals from 0 to 0.83 μs. Using the AWG, the signals were then played with a maximum voltage of ±250 mV to the input of the chirp compressor. FIG. 3F(d-f) show the recorded output signals with Rout=50Ω. The SNR is evaluated at the output as:

$$SNR = \frac{V_{max}^2}{2V_{rms}^2} \quad (17)$$

$V_{max}$ is the maximum voltage and $V_{rms}$ is the root-mean-squared voltage for 1.5 μs<t<3 μs, when the chirp is not present and only noise is recorded. SNR enhancement factors of 128, 313, and 580 were obtained for input signals with SNR=10, 1, and 0.1, respectively. These factors are larger than the TB product (100) because the filtering characteristics of the device, as shown in FIG. 3D(c), provide significant larger attenuation to the out of band noise (0-0.18 and 0.3-1 GHz) than to the chirp signal (0.18-0.3 GHz). Particularly, even when the signal is completely masked by the noise at the input with SNR=0.1, the correlation provided by the device makes the signal distinct at the output. Note that the out of band rejection of the chirp compressors is slightly degraded due to the unintended transmission band (e.g. S0 band in an SH0 device). In spite of this fact, the SNR enhancement is still remarkable. By applying some of the spurious mitigation techniques that have been developed for LiNbO$_3$ resonators, it is possible to reduce the presence of the unintended mode.

Figure 3G:
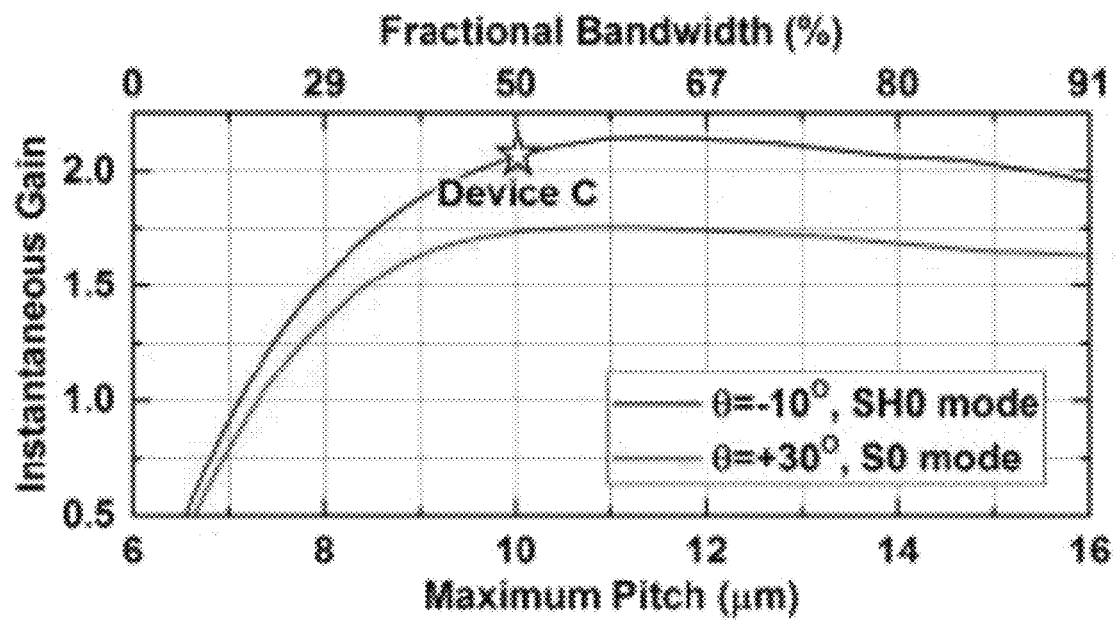
FIG. 3G illustrates the calculated instantaneous voltage gain, in accordance with embodiments of the disclosure.
Figure 3G:
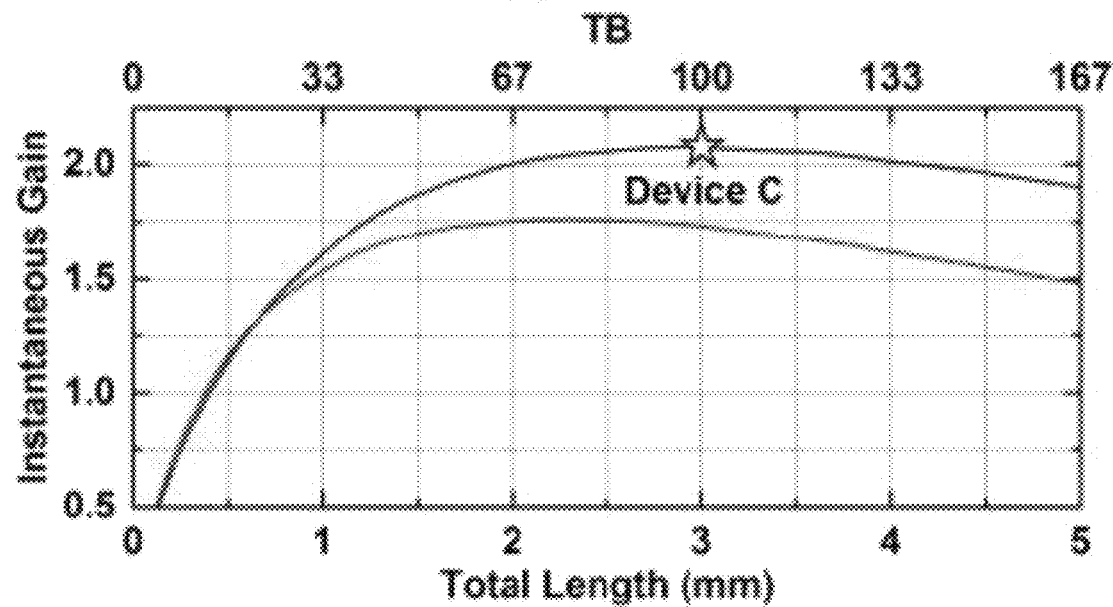

FIG. 3G illustrates the calculated instantaneous voltage gain, in accordance with embodiments of the disclosure. With all the extracted parameters, the performance of chirp compressors can be analyzed as a function of key design parameters for optimization purposes. Particularly, it is useful to analyze the voltage gain as a function of the device length, with the extracted propagation loss characteristics. FIG. 3G plots the calculated instantaneous voltage gain based on the models for SH0 and S0 modes, at their optimal orientations, as a function of the FBW and device length, $L_T$–$L_G$. The optimal port impedances and matching inductors are used in each calculation to obtain a matched response. As seen in FIG. 3G(a), the loss due to the impedance mismatch degrades the gain as the FBW increases beyond 60%, which is slight lower than the approximate limits established by equation (10). The calculations include the effect of exciting the unintended modes, i.e. S0 mode for θ=−10° and SH0 mode for θ=+30°. Since these modes feature a low $k^2$ of 2%, their presence does not significantly alter the voltage gain, even though both transmission bands overlap for FBW>53% (θ=−10°) and 40% (θ=+30°).

In FIG. 3G(b), the influence of the device length is plotted. A decrease in the voltage gain is observed for lengths above 3 mm (SH0) and 2 mm (S0). This results from the trade-off between the increasing TB product achieved with a longer device and the associated higher propagation loss. Given the coupling and propagation coefficients stated herein, these calculations show that design C is close to attaining maximum gain possible for lateral modes in thin film LiNbO3 in the frequency range of described herein. Understandably, with the same FBW, the TB product can be increased by scaling-up the chirp center frequency. However, it comes at a cost of increased propagation loss [see equation (15)], thus resulting in a different optimum device length. Therefore, the trends shown in FIG. 3G can be taken into account at a system level to jointly exploit the center frequency, processing gain TB, and the overall instantaneous gain, $g_v$, so that the SNR and voltage at the input of the next stage in the system can be maximized.

Figure 3H:
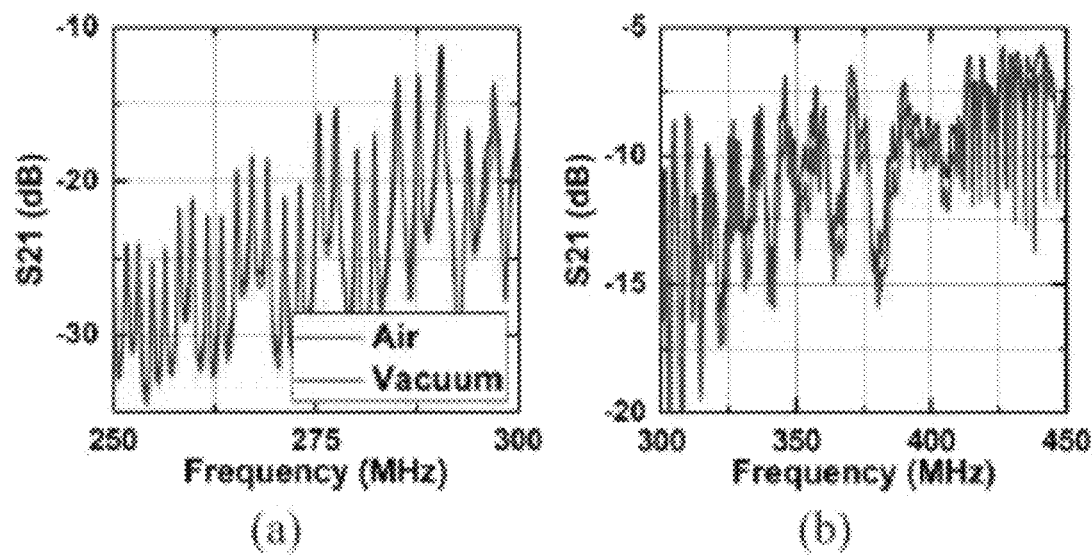
FIG. 3H illustrates measured s21 for device D (of Table 2) in air and vacuum, in accordance with embodiments of the disclosure.

FIG. 3H illustrates measured s21 for device D (of Table 2) in air and vacuum, in accordance with embodiments of the disclosure. To explore the loss mechanisms contributing to the propagation loss, additional tests were performed in a Lakeshore TTP-X™ probe station with controlled pressure and temperature. FIG. 3H shows a comparison of measured S21 of Device D in dry air and under vacuum of $5.4 \cdot 10^{-6}$ mbar, both at room temperature. The measurement under vacuum shows a constant 1 dB improvement in S21 over both SH0 and S0 transmission bands, implying a reduced propagation loss. The comparison indicates that, although not negligible, the air damping is not the dominant loss mechanism for chirp compressors working at radio frequencies. From equation (11), it can be inferred that a maximum increase of 12% in the voltage gain can be obtained by vacuum packaging the device.

Figure 3I:
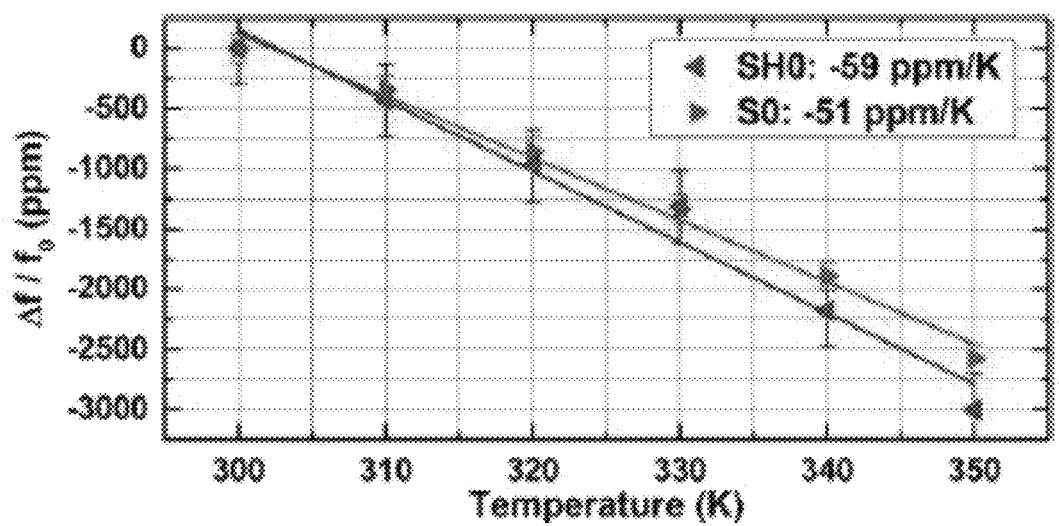
FIG. 3I illustrates measured frequency variation for device C induced by temperature variation, in accordance with embodiments of the disclosure.

FIG. 3I illustrates measured frequency variation for device C induced by temperature variation, in accordance with embodiments of the disclosure. The temperature stability of the chirp compressors, as characterized by the temperature coefficient of frequency (TCF), has also been investigated as it is a main performance specification for RF devices. The TCF's of Device C were experimentally determined by six measurements at equidistant temperature points between 300 and 350 K. In each measurement, the frequency variation was evaluated by tracking the peak frequency change of one of the ripples present in both the SH0 and S0 transmission bands. The results are plotted in FIG. 3I along with the linear fitting, showing TCF's of −59 ppm/K for SH0 and −51 ppm/K for S0. As expected, these TCF's are lower than the measured values of resonant devices made of only LiNbO3 films, since the SiO2 layer underneath LiNbO3 provides temperature compensation. To evaluate the degradation in chirp compression induced by temperature variation, calculations were done for various chirps that had different frequency offsets (TCF−ΔT) from the design frequencies of the compressors. Calculations based on the model show that, thanks to the wide BW and low TCF's, the chirp compressors reported in this paper all experience less than 6% degradation in the voltage gain over a wide temperature range of ±100 K. Thermally-induced nonlinear phenomena will not hinder the operation of the chirp compressors, as they are expected to process wake-up signals at very low power levels (<−50 dBm).

In implementations, chirp compression using SH0 and S0 waves in X-cut LiNbO3 has been demonstrated to simultaneously enhance the SNR and amplify voltage amplitude of the signal at RF. Devices based on both modes and with several lengths, aperture sizes, and center frequencies have been designed, modeled, fabricated and characterized. The model considers both modes, and matches the measured responses of the fabricated devices. Large electromechanical couplings have been extracted, 39% for SH0 and 30% for S0, allowing for high FBW chirps (up to 70%), while keeping the insertion loss at 10 dB over the entire passband. Leveraging these characteristics, an instantaneous voltage gain of 5 has been achieved with a device featuring a processing gain of 100, a bandwidth of 125 MHz, a center frequency at 270 MHz, and a differential time delay of 833 ns. The same device also demonstrates a SNR enhancement larger than 100, when subjected to a wideband input up to 1 GHz. The design space has also been analyzed to understand the optimization of the voltage gain with respect to the key design parameters. Operation in vacuum has been explored, showing a slight improvement in the insertion loss of around 1 dB. Finally, it has been found that temperature variations over a wide range of ±100 K do not significantly affect the performance in terms of voltage gain. All in all, this new class of devices offers new possibilities for implementing near zero power wake-up receivers, and potentially transforms the operation of wirelessly connected things in IoT.

Figure 4:
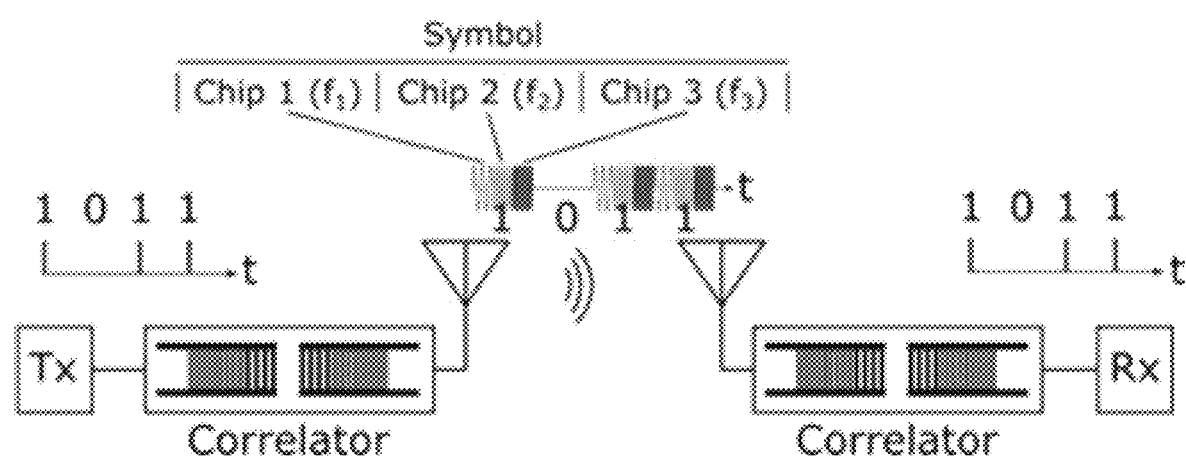
FIG. 4 illustrates a transmitter and receiver that implement correlators, according to embodiments of the present disclosure.

FIG. 4 illustrates a transmitter and receiver that implement correlators, according to embodiments of the present disclosure. It can be noted that a correlator can be considered a type of passive voltage gain device. In embodiments, Spread Spectrum (SS) communication is a radio frequency (RF) technique, with which each symbol in the data stream is represented with a code to improve security, enhance signal to noise ratio, and reject uncooperative interference. The coding spreads the signal spectrum over a bandwidth larger than what the data rate minimally requires. To share usage of the same bandwidth by many users, numerous sets of orthogonal codes can be employed. Among various coding schemes, the orthogonal frequency coding (OFC) provides the benefits of high time-bandwidth products and rich diversity in codes. As shown in FIG. 4, OFC encodes each symbol with a train of chips at orthogonal frequencies. Acoustic correlators, also referred as matched filters, can be used to code the signal at the transmitter and recover the original data at the receiver by performing correlation directly at RF without consuming power. The deployment of correlators as described herein can lead to circumvention of baseband correlation techniques that require complex digital signal processing and high power consumption. Conventionally, acoustic correlators have been implemented based on surface acoustic wave (SAW) devices, which so far are limited in performance due to their moderate bandwidths (set by the electromechanical coupling $k^2$) and high propagation loss.

In some implementations, a frequency correlator based on shear horizontal waves in a suspended lithium niobate thin film is described. The device consists of symmetrically arranged input and output ports, each with a number of section (e.g., five sections) of transducers for a number (e.g., five) transmission bands over a wide frequency range (e.g., from 154 to 297 MHz). The high electromechanical coupling of lithium niobate provides a fractional bandwidth over 60%, outperforming the state of the art surface acoustic wave correlators with a comparable insertion loss. The correlation has been verified with time-domain measurements, showing a voltage amplification factor of 2 for a correlated input, with respect to its time reversal.

Figure 5A:
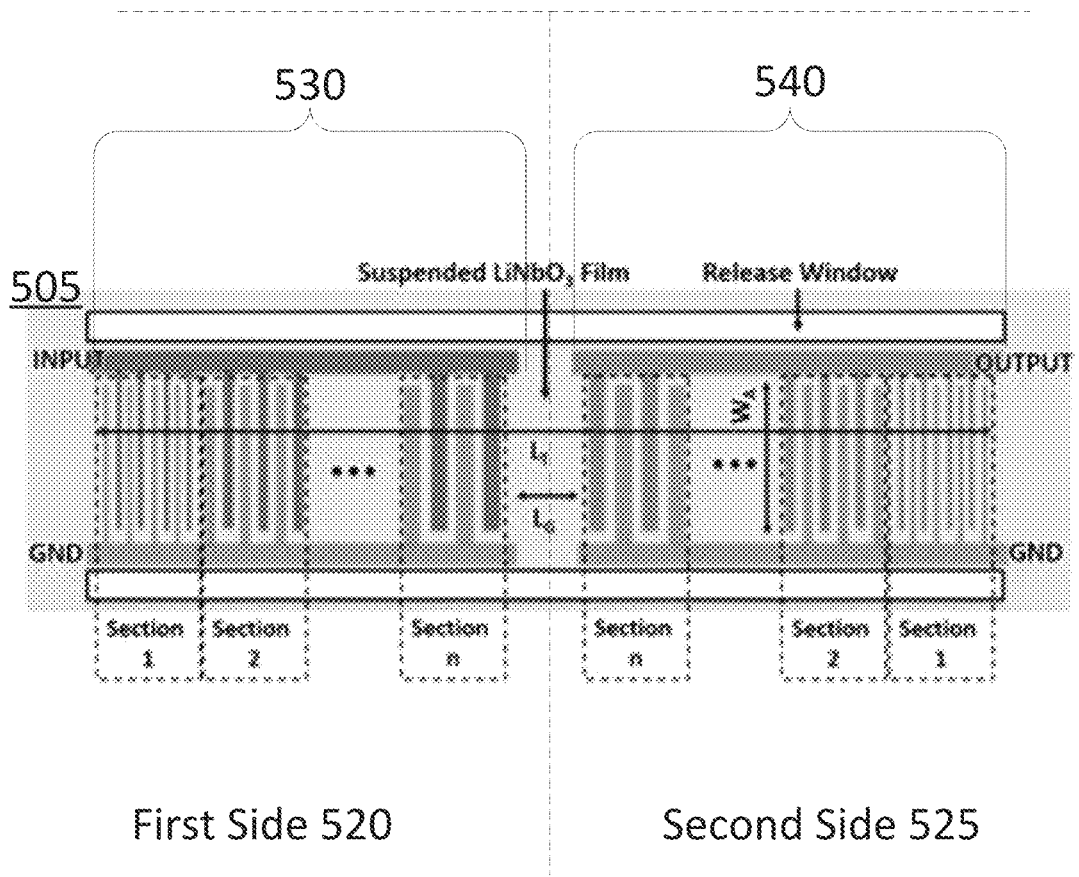
FIG. 5A illustrates a correlator, according to embodiments of the present disclosure.

FIG. 5A illustrates a correlator, according to embodiments of the present disclosure. In embodiments, correlator 500 can be similar to chirp compressor 200 as described above with respect to FIG. 2.

In embodiments, the correlator includes a piezoelectric thin-film 505 suspended above a carrier substrate. The piezoelectric thin-film 505 has a horizontal axis 515 orientated along a length of the piezoelectric thin-film 505 and a center axis 510 orientated along a width of the piezoelectric thin-film 505. The horizontal axis 515 is perpendicular to the center axis 510. The piezoelectric thin-film 505 includes a first side 520 and a second side 525 with respect to the center axis 510.

In embodiments, an input interdigital transducer (IDT) 530 includes first interdigitated electrodes (e.g., section 1 though section n on the first side 520) disposed at different locations along the horizontal axis 515 and on the first side 520 of the piezoelectric thin-film 505. Each opposing pair (e.g., section 1, etc.) of the first interdigitated electrodes is to selectively transduce a particular frequency range of an input electrical signal that varies in frequency over time into an acoustic wave of a laterally vibrating mode based on a pitch (W) between electrodes of the opposing pair.

In embodiments, an output IDT 540 includes second interdigitated electrodes (e.g., section 1 though section n on the second side 525) disposed at different locations along the horizontal axis 515 and on the second side 525 of the piezoelectric thin-film 505. Each opposing pair of the second interdigitated electrodes (e.g., section 1 though section n on the second side 525) corresponds to a respective opposing pair (e.g., section 1 though section n on the first side 520) of the first interdigitated electrodes of equal pitch. Each opposing pair of the second interdigitated electrodes is to convert the acoustic wave transduced by the respective opposing pair of the first interdigitated electrodes into a compressed pulse.

In embodiments, the correlator can receive an input electrical signal (as shown in FIG. 4) at the input IDT 530. The input electrical signal includes discrete frequency components arranged in an order in time. For example, the input electrical signal can have a first frequency component (e.g., 200 MHz) at a first time, a second frequency component (e.g., 230 MHz) following the first frequency component in time, and a third frequency component (e.g., 260 MHz) following the second frequency component in time. The discrete frequency components of the input electrical signal are collected at the output IDT 540 concurrently to form a compressed pulse having a voltage gain greater than 1.

In embodiments, the acoustic frequency correlator 500 can include a delay line formed by two identical interdigital transducers (IDT) on a suspended piezoelectric thin-film, such as X-cut LiNbO3 thin film. In embodiments, the piezoelectric thin-film 505 can is oriented $-10°$ to $-Y$ axis to provide high electromechanical coupling for the SH0 mode. Both IDTs 530 and 540 are divided into n sections, with each section having a different electrode pitch $W_i$. Each transducer section can convert electrical signals into acoustic waves and vice versa within a frequency band centered at:

$$f_i = \frac{v_p}{2w_i} \quad (18)$$

$v_p$ is the phase velocity of SH0. The approximate bandwidth of each transducer section is:

$$B_i = \frac{2f_i}{N_i - 1}, \quad (19)$$

$N_i$ is the number of electrodes in Section i.

As illustrated in FIG. 5, the distance from Section i at the input IDT 530 to Section i at the output IDT 540 decreases with the section number, i. The correlator 500 can establish correlation with an input symbol that is coded with a succession of chips consisting of sinusoids with frequencies, $f_i$, durations, $(N_i-1)/2f_i$, and delays $(N_i-1)/f_i$, in the same order as the sections in the input transducer of the correlator 500. When such a signal is received by the input IDT 530, the time differences between different chips in the signal are exactly compensated by the acoustic delays introduced by the correlator 500, resulting in all sinusoids to overlap in time at the output IDT 540. As a result, a compressed version of the input signal is produced at the output, with a shortened duration and magnified instantaneous power. The processing gain, defined as the magnification factor in terms of instantaneous power, is approximately the number of chips, n. To achieve the processing gain of n, all sections in the transducers can be orthogonal to each other. In other words, each section can be maximally responsive to its own designated chip frequency (i.e., center frequencies of transducer sections are also the chip frequencies) while presenting transduction nulls at the center frequencies of any other transducer section.

In embodiments, design a frequency correlator 500 meeting the orthogonality condition, the impulse model is used to select the center frequencies. This model considers the time-domain impulse response of an IDT. Specifically, the impulse response is modeled as a sinusoid with zero-crossings at the electrodes. In embodiments, the impulse response of each section in the IDTs is a sine function of frequency $f_i$ and duration $(N_i-1)/2f_i$. The frequency response of each section can be obtained by performing Fourier-transform on its impulse response. The result is a cardinal sine function (or sinc) centered at $f_i$ and with zeros at:

$$f_i^k = f_i\left(1 \pm \frac{4k}{N_i - 1}\right), k = 1, \ldots, \infty. \quad (20)$$

In order for all transducer sections to be orthogonal to each other, they can meet:

$$(N_i-1)W_i=(N_j-1)W_j, \forall i,j, \text{ where } f_i \neq f_j. \quad (21)$$

This condition implies that all transducer sections in the correlator 500 have the identical length, and the chips in the signal have the identical duration.

In an example, an OFC correlator can be implemented using 5 transducer sections, each with a length of 300 μm and corresponding to a chip in the signal. The smallest pitch, which defines the highest frequency, is 6 μm. The successive sections can be designed by choosing the numbers of electrodes as $N_j=N_i-2k$ and calculating $W_j$ according to equation (21). The number of zeros between the two center frequencies of adjacent sections is $k-1$.

Figure 5B:
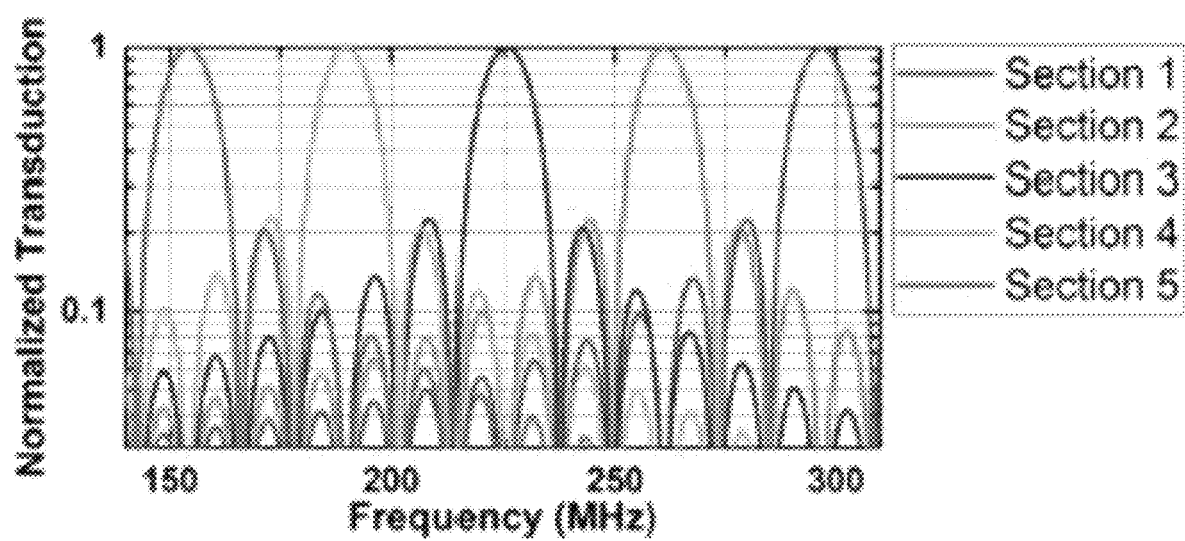
FIG. 5B illustrates frequency-domain responses of the individual transducer sections and values of the electrode pitch and number of electrodes, according to embodiments of the present disclosure.

FIG. 5B illustrates frequency-domain responses of the individual transducer sections and values of the electrode pitch and number of electrodes, according to embodiments of the present disclosure.

TABLE 6

| Section | $W_i$ (μm) | $N_i$ | $f_i$ |
|---|---|---|---|
| 1 | 6 | 51 | 296.9 |
| 2 | 6.818 | 45 | 261.2 |
| 3 | 7.895 | 39 | 225.6 |
| 4 | 9.375 | 33 | 190 |
| 5 | 11.539 | 27 | 154.4 |

In the current example, k was set to 3, giving rise to two zeros between the center frequencies of adjacent sections, as illustrated in FIG. 5B. Table 6 lists the values of the electrode pitch, the number of electrodes in each section, and the center frequencies predicted by assuming a phase velocity of 3562 m/s. For all sections, the electrode width is set to half of the pitch. A separation between the input and output transducers for chip 5 ($L_G$) of 100 μm was chosen, resulting in a total device length ($L_T$) of 3.1 mm. The acoustic aperture ($W_A$) was fixed to 200 μm to attain a port impedance in the range of 100-500Ω at all chip frequencies. The limitation imposed by equation (21) makes it impractical to establish impedance matching to 50Ω at all chip frequencies. Due to the differences in impedance for the set of center frequencies, designs with high fractional bandwidths are prone to suffer from a high insertion loss. Materials with high $k_2$ benefit from a lower insertion loss for a given bandwidth.

Figure 6A:
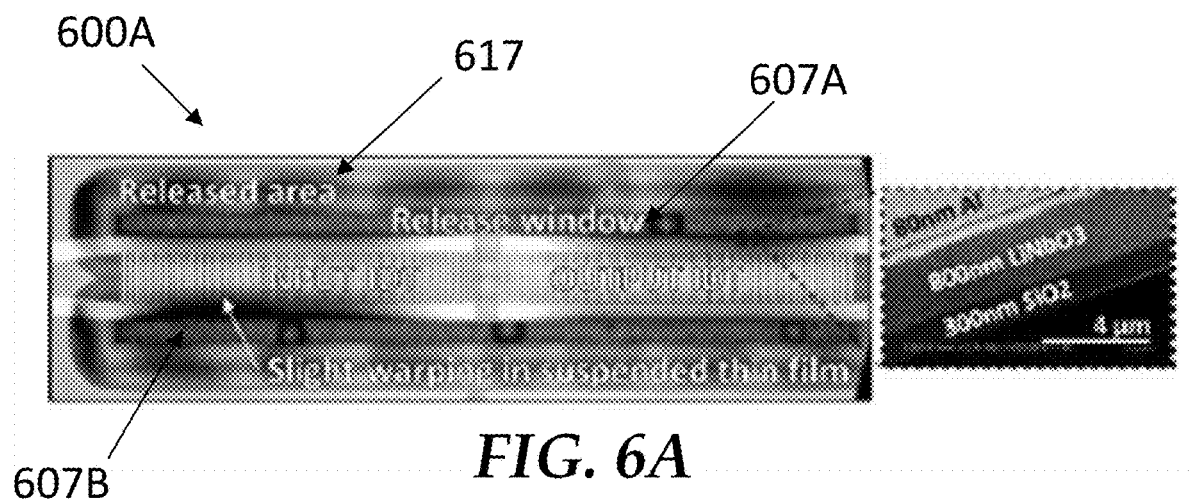
FIGS. 6A and 6B illustrate a top view of the chirp compressor and correlator, respectively, according to embodiments of the present disclosure.
Figure 6B:
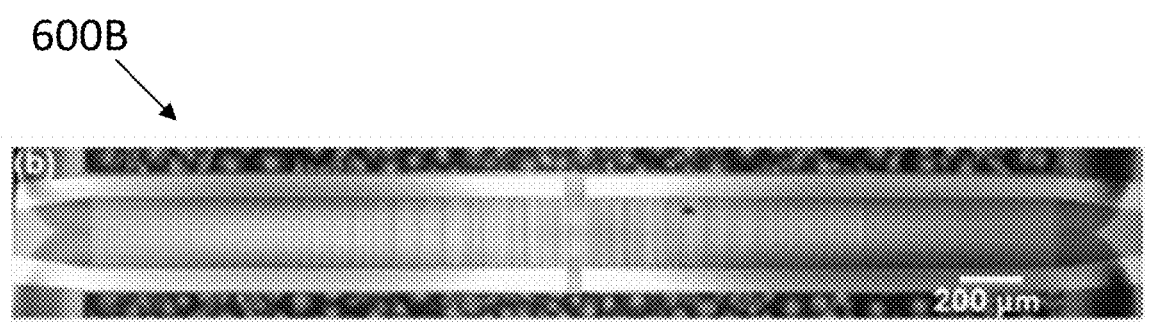

FIGS. 6A and 6B illustrate a top view of the chirp compressor 600A and correlator 600B, respectively, according to embodiments of the present disclosure. FIG. 6A shows a top-view of the chirp compressor 600A. FIG. 6B shows a top-view of a fabricated correlator 600B. By way of example of these two structures, the chirp compressor 600A includes a pair of release windows 607A and 607B similar to was discussed with reference to FIG. 2. As will be discussed in more detail with reference to FIG. 10, the release windows may be accessed (or used) to etch a release area 617 underneath the IDTs, e.g., to form a cavity disposed between the piezoelectric thin film and the carrier substrate. More specifically, the release area 617 may be the cavity in some embodiments. The correlator 600B may be similarly formed with release windows and a release area that optionally forms such a cavity.

Figure 7:
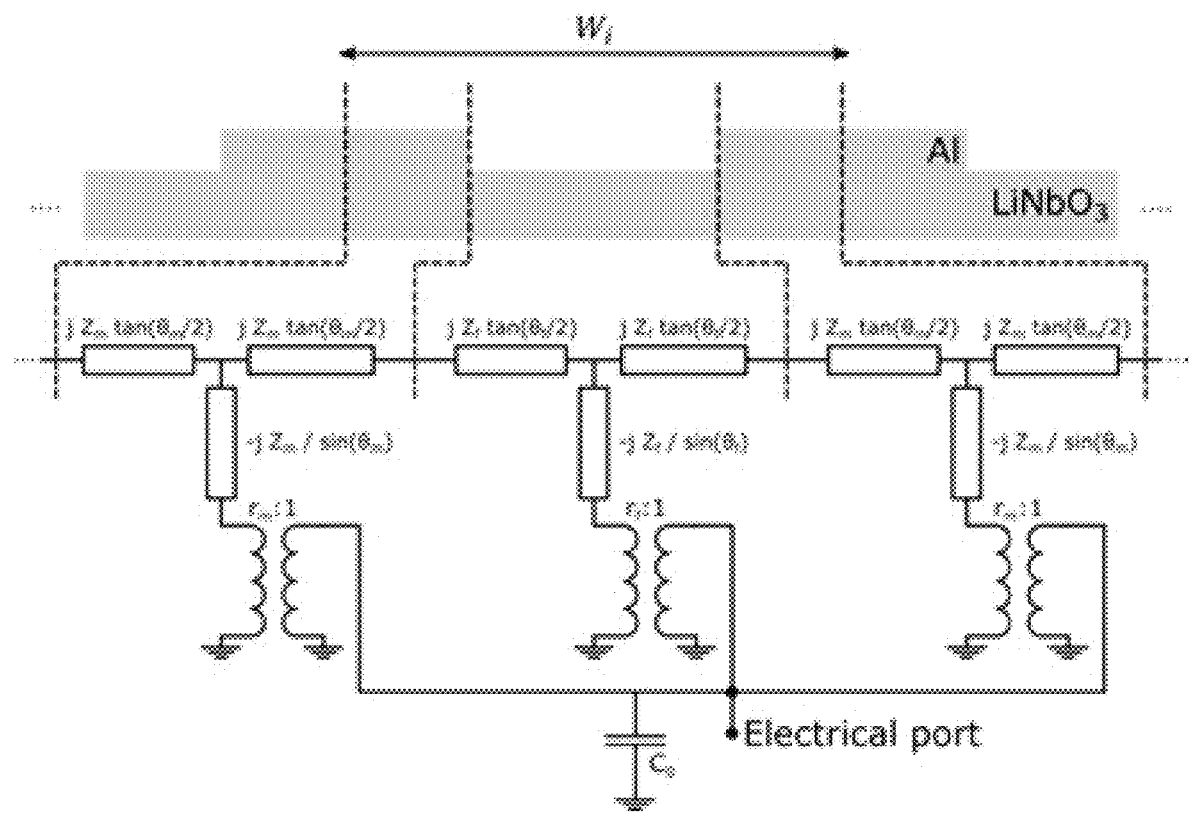
FIG. 7 illustrates a circuit model of the correlator, according to embodiments of the present disclosure.

FIG. 7 illustrates a circuit model of the correlator, according to embodiments of the present disclosure. The response of the fabricated 2-port OFC frequency correlator was simulated by using the aforementioned impulse model. The impulse responses of both the input and output transducers are calculated as the superposition of the impulse responses of the individual sections. Adequate time delays are employed to account for the spatial separation between sections for different frequencies. The acoustic radiation can be modelled by an admittance derived from the impulse response.

Although the impulse model provides great flexibility and simplicity to simulate the response of large arrays of electrodes on piezoelectric substrates or thin films, it can be inadequate in accounting for the discontinuities in the acoustic propagation medium induced by the succession of metallized and un-metallized areas. The presence of a metal on top of a piezoelectric material has the effect of short-circuiting the surface, reducing the electric field within the film. This translates into a difference between the phase velocities in the portions covered by an electrode ($v_p^m$) and those free of metalization ($v_p^f$), given by:

$$v_p^f = v_p^m \left(1 + \frac{k^2}{2\left(1 + (\epsilon_{11}\epsilon_{33} - \epsilon_{13}^2)^{-1/2}\right)}\right) \quad (22)$$

$\epsilon_{11}$, $\epsilon_{33}$ and $\epsilon_{31}$ are components of the relative permittivity tensor under constant stress, with 1 denoting the direction of wave propagation and 3 denoting the direction normal to the surface. For large values of $k^2$, as it is for SH0 waves in thin film $LiNbO_3$, this difference produces non-negligible reflections as the acoustic wave goes through the numerous portions of metalized and un-metalized thin film in the transducers. To account for this effect, the Mason's model can be used. This method exploits a 1-D discretization of the delay line, in which each period of the transducer is modelled as a sectional equivalent circuit. Acoustic transmission line elements are introduced to model the wave propagation, while ideal transformers are included to account for the piezoelectric transduction. The model was modified as in to include the aforementioned discontinuity in phase velocity. FIG. 7 shows the equivalent circuit used to represent each period of the transducer, with $Z_f$ denoting the acoustic impedance of the free $LiNbO_3$ film and $Z_f$ denoting the acoustic impedance of the metallized $LiNbO_3$ film. $Z_f$ and $Z_m$ are related by:

$$\frac{Z_f}{Z_m} = \frac{v_f}{v_m}. \quad (23)$$

$\theta_m$ is the acoustic transit angle over half of an electrode for an acoustic wave at frequency ω. If the metallization factor, i.e. the ratio of the metallized to un-metallized area in each section, is denoted by m, $\theta_m$ is given by:

$$\theta_m = m\frac{\omega W_i}{2v_p^m} \quad (24)$$

Analogously, $\theta_f$ is the acoustic transit angle over the un-metalized portion between adjacent electrodes for an acoustic wave at frequency ω, given by:

$$\theta_f = (1-m)\frac{\omega W_i}{v_p^f} \quad (25)$$

The turn ratios of the ideal transformers are found as:

$$r_m = \sqrt{2f_iC_0k^2Z_m}. \quad (26)$$

$$\text{and } r_f = \sqrt{2f_iC_0k^2Z_f} \quad (27)$$

In Mason's model, equation (18) is no longer accurate in determining the transducer center frequency. Instead, the center frequency of each transducer Section can be obtained as:

$$f_i = \frac{1}{2}\frac{1}{\left(m\frac{w_i}{v_p^m} + (1-m)\frac{w_i}{v_p^f}\right)}. \quad (28)$$

The entire input and output transducers are built by cascading the described blocks in series. The electrical terminals of all blocks in a transducer are connected in parallel, forming an electrical port. The correlator model is then constructed by cascading the models of the two IDTs in a symmetrical arrangement, and terminating the remaining acoustic edges with a resistance, $Z_f$, to represent a non-reflective boundary.

Figures 8A, 8B, 8C:
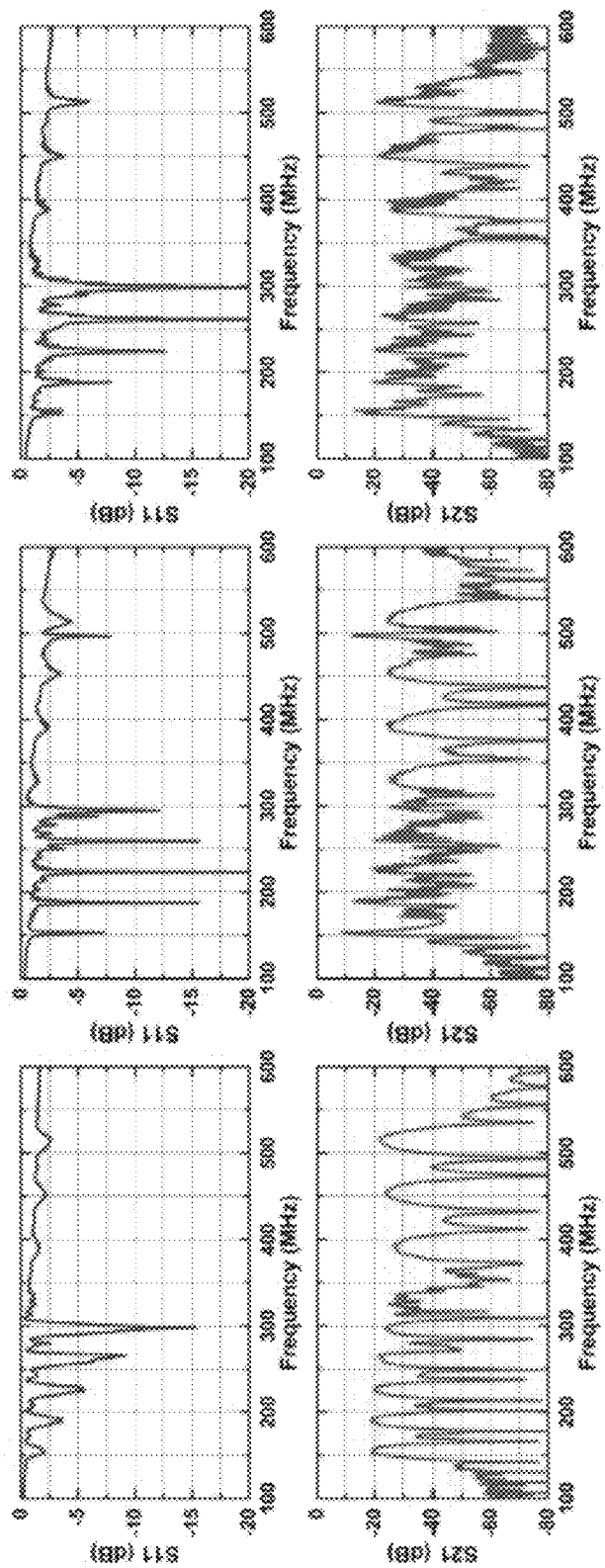
FIGS. 8A, 8B, and 8C illustrate S-parameters of the correlator, in accordance with embodiments of the disclosure.

FIGS. 8A, 8B, and 8C illustrate S-parameters of the correlator, in accordance with embodiments of the disclosure. Both models described above were implemented for numerical calculation of the correlator response. The S11 and S21 parameters calculated with the impulse model, implemented in simulation, are shown in FIG. 8A. A phase velocity of 3562 m/s was assumed for the SH0 mode. Mason's model was implemented with ADS and the results are plotted in FIG. 8B. In this case, $v_p^m$=3450 m/s and $v_p^f$=4110 m/s. For both models, $k^2$=39% was used. In addition, the transduction of the S0 mode, at higher frequencies, was considered in both models. To that end, an additional branch of cascaded sectional circuits with $k^2=3.3\%$ was added in parallel to the intended SH0 branch. This S0 branch is modeled with a phase velocity of 6175 m/s in the impulse model, while $v_p^m=6200$ m/s and $v_p^f=6300$ m/s are used in Mason's model. Note that the disparity between $Z_f$ and $Z_m$ is significant due to the high electromechanical coupling of SH0 in LiNbO$_3$. As a result, acoustic wave propagation experiences non-negligible internal reflections within the IDTs. As predicted by Mason's model, this effect creates large ripples over the transmission bands, which are not present in the response predicted using the impulse model. The S-parameters of the fabricated device were first measured with a vector network analyzer, and are shown in FIG. 8C.

Figure 9:
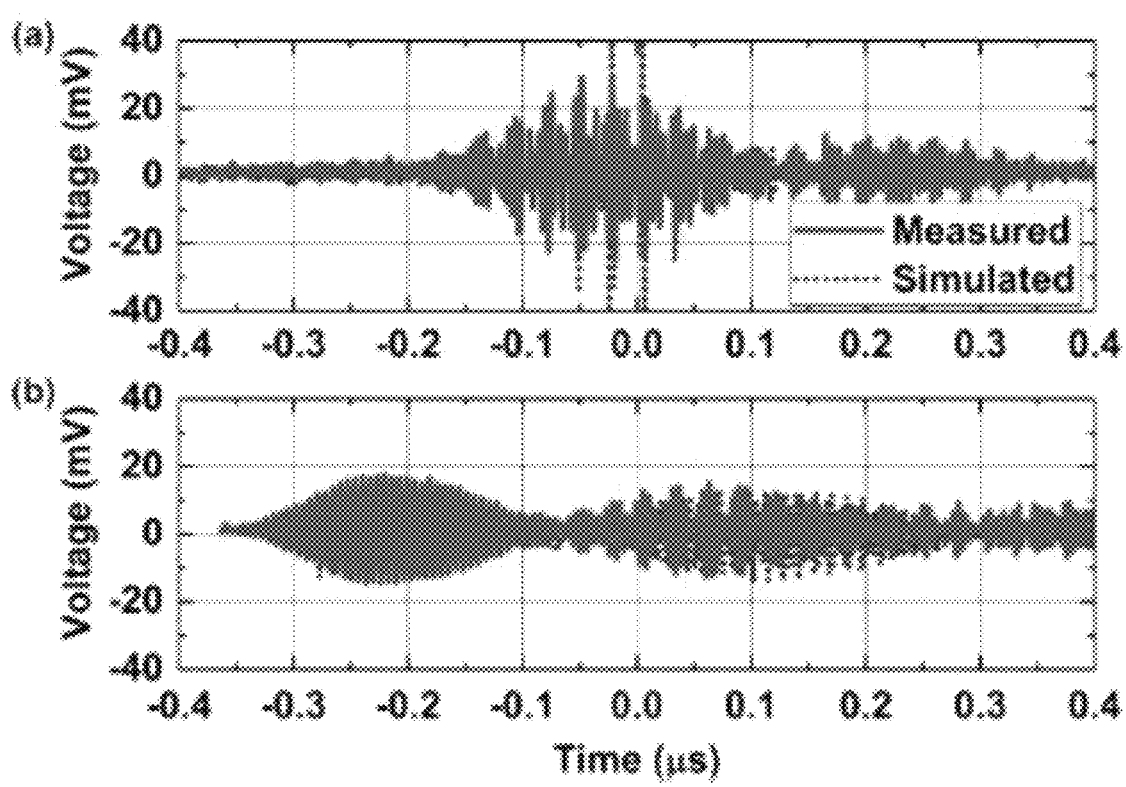
FIG. 9 illustrates measured and simulated correlator output signals for different inputs, in accordance with embodiments of the disclosure.

FIG. 9 illustrates measured and simulated correlator output signals for different inputs, in accordance with embodiments of the disclosure. With 50Ω terminations at both ports, the insertion losses (IL) at the center frequencies of the first four chips (154, 190, 226, and 261 MHz) are around 20 dB. The chip with the highest frequency at 297 MHz endures a higher IL (30 dB) due to the response distortion from inadvertently excited S0 mode. Care must be taken in design in order to avoid any overlap between SH0 and S0 transmission bands that degrades the performance for higher frequency chips. In addition, the model shows an increasing IL for chips at higher frequencies. This is caused by the longer propagation distance in our design for the higher frequency chips, as well as the fact that propagation loss per unit distance is higher at higher frequencies. This demonstration shows a lower IL and a much larger fractional bandwidth (FBW=63%) than that reported for similar SAW correlators (IL≈35 dB, FBW=29%).

The time-domain response was also measured to verify the correlation. The device was measured as a receiver correlator, to which an input signal coded with frequency chips and produced by an arbitrary wave generator was fed. The response at the output IDT was recorded by an oscilloscope. FIG. 9 shows the measured correlated signal, compared to the response for the timereversal signal (uncorrelated). The amplitude for the correlated signal is found to be more than 2 times larger than that of the uncorrelated signal.

A frequency correlator based on SH0 waves in a suspended lithium niobate thin film has been demonstrated with higher bandwidth than previously reported SAW devices. An impulse model and a Mason's model have been used to simulate the response and design the device. The measurements show a much better agreement with Mason's model because Mason's model accounts for the acoustic reflections at the edges of the electrodes. The correlation response has been validated with time domain measurements. This new class of devices have been demonstrated as a potential zero-power solution for performing correlation directly at RF.

Figure 10:
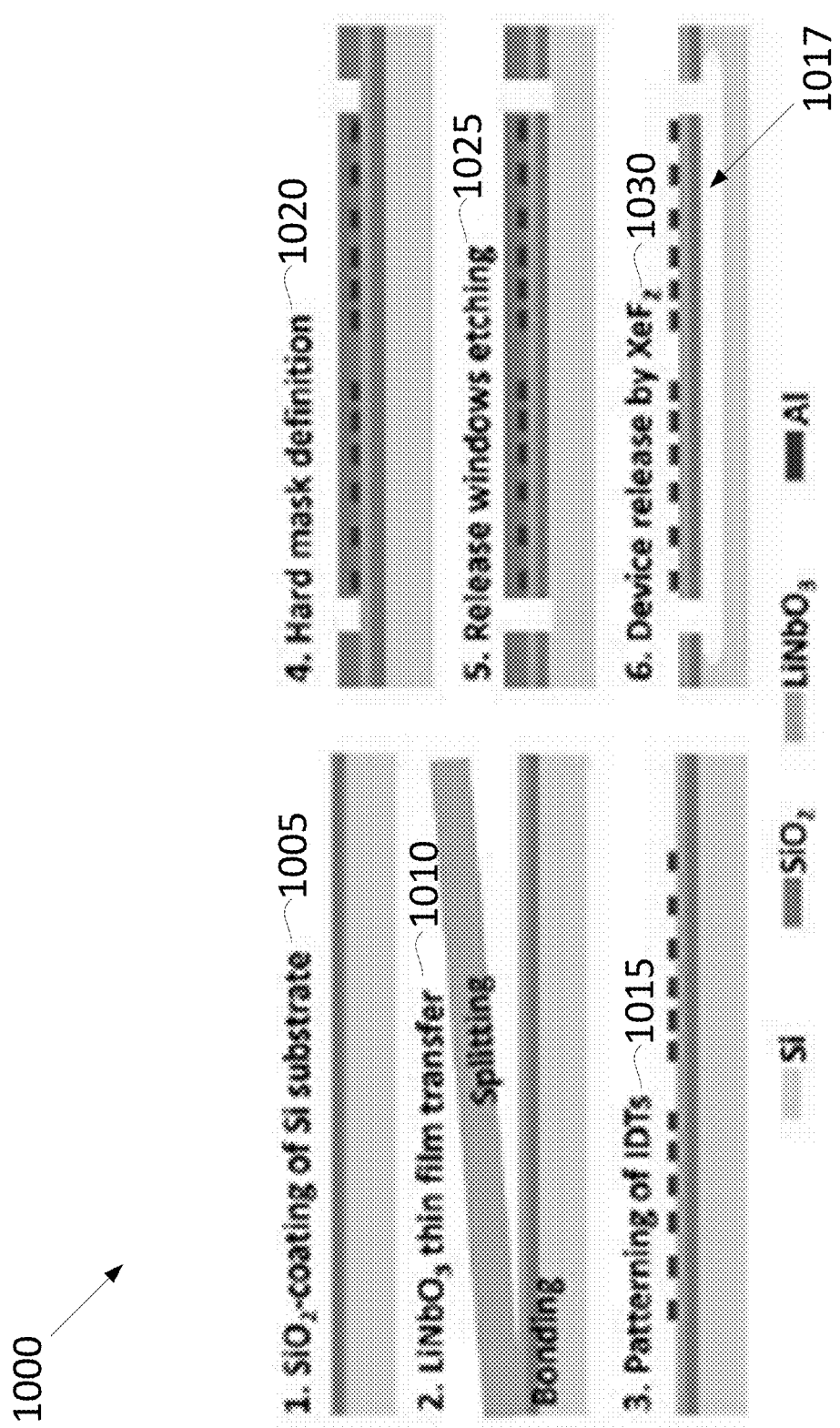
FIG. 10 illustrates a flow diagram of a fabrication process for a passive voltage gain device, according to embodiments of the present disclosure.

FIG. 10 illustrates a flow diagram of a fabrication process for a passive voltage gain device, according to embodiments of the present disclosure. It should be appreciated that features of FIGS. 1-9 may be described below to help illustrate method 1000. Method 1000 may be performed as operations. It should be appreciated that method 1000 may be performed in any order and may include the same, more, or fewer operations. It should be appreciated that method 1000 may be performed by one or more pieces of semiconductor fabrication equipment or fabrication tools.

At operation 1005, an intermediate layer is formed above a first material (also referred to as "base material layer" herein). In embodiments, the first material is a carrier substrate, such as a silicon (Si) substrate. In some embodiments, the first material is a carrier single-crystal Si wafer. In some embodiments, the intermediate layer is a layer of silicon oxide (SiO$_2$). In some embodiments, the intermediate layer is 300 nm thick. In some embodiments, the intermediate SiO2 layer is used to facilitate wafer to wafer bonding.

At operation 1010, a piezoelectric thin-film is transferred onto the intermediate layer. In some embodiments, the piezoelectric thin-film is one of lithium niobate thin-film or lithium tantalate thin-film. In one embodiment, the piezoelectric thin-film is X-cut LiNbO3. In embodiments, the piezoelectric thin-film is one of X-cut Z-cut, Y-cut, or rotated X, Y, or Z-cut lithium niobate thin-film. In other embodiments, the piezoelectric thin-film is a lithium tantalate thin-film.

In embodiments, the piezoelectric thin-film is obtained using a crystal ion slicing process prior to bonding the piezoelectric thin-film. In the crystal ion slicing process a slice of thin film is removed from a bulk material wafer by ion implementation. Ion implantation is used to create a buried sacrificial layer in a single-crystal wafer, inducing a different etching selectivity between the sacrificial layer and the rest of the sample. In some embodiments, the H+ ions (hydrogen) are implanted in the piezoelectric thin-film wafer to induce micro-cracks several hundred nanometers beneath the surface. The depth at which the micro-cracks reside is controlled by the energy of the implanted ions. The piezoelectric thin-film wafer is sliced via thermally expanding the micro-cracks, leaving a thin film (e.g., 800 nm).

At operation 1010, subsequent to transferring the piezoelectric thin-film, the piezoelectric thin-film is bonded to the intermediate layer. Many bonding techniques can be used, and can include but are not limited to, direct bonding and thermal compression. In embodiments, the piezoelectric thin-film has a horizontal axis orientated along a length of the piezoelectric thin-film and a center axis orientated along a width of the piezoelectric thin-film. The piezoelectric thin-film includes a first side and a second side with respect to the center axis.

In embodiments, an ion slicing process prior to bonding the piezoelectric thin-film is not used. A piezoelectric thin-film can be bonded to the intermediate layer and polished or grinded to a predetermined thickness.

At operation 1015, an input interdigital transducer (IDT) and an output IDT are formed on the piezoelectric thin-film. In embodiments, the input IDT includes first interdigitated electrodes disposed at different locations along the horizontal axis and on the first side of the piezoelectric thin-film. The pitches of opposing pairs of the first interdigitated electrodes vary along the horizontal axis. The output IDT includes second interdigitated electrodes disposed at different locations along the horizontal axis and on the second side of the piezoelectric thin-film.

In some embodiments, the input IDT and the output IDT are symmetric about the center axis. The first opposing pair of the first interdigitated electrodes that is nearest to the center axis has an equal pitch and is located an identical distance from the center axis as a corresponding first opposing pair of the second interdigitated electrodes that is nearest to the center axis. The second opposing pair of the first interdigitated electrodes that is farthest from the center axis has an equal pitch and is located an identical distance from the center axis as a corresponding second opposing pair of the second interdigitated electrodes that is farthest from the center axis.

In embodiments, the input and output transducers of the passive voltage gain device are defined by sputter—depositing a conductive material (e.g., 80 nm of aluminum (Al)) and liftoff. In other embodiments, other conductive materials can be used such as gold, copper, tungsten, platinum, and their alloys.

At operation 1020, a hardmask layer is formed above the input IDT, the output IDT, and exposed piezoelectric thin-film. In embodiments, to define the delay line structure, a hardmask layer of SiO2 is formed. In some embodiments, the hardmask is deposited using plasma-enhanced chemical vapor deposition (PECVD). In some embodiments, the hardmask layer is formed so that hardmask material is excluded from the area of the release windows. In some embodiments, the portions of the hardmask layer can be etched to form one or more release windows. For example, fluorine-based reactive ion etching (RIE) can be used to pattern the hard mask and create the release windows.

At operation 1025, portions of the piezoelectric thin-film and portions of the intermediate layer are etched via the one or more release windows, which were discussed with reference to FIGS. 2 and 6A-6B. In embodiments, a chlorine-based inductive coupled plasma (ICP)-RIE is used to etch portions of the piezoelectric thin-film and portions of the intermediate layer.

At operation 1030, the remaining portion of the hardmask layer is removed by, for example, RIE. The passive voltage gain device is released by removing the material below the remaining portion of the piezoelectric thin-film to form a cavity 1017. In some embodiments, the passive voltage gain device is released by removing the Si underneath with XeF2-based isotropic etching. In some embodiments, the intermediate layer below the piezoelectric thin-film is removed. In some embodiments, the intermediate layer below the piezoelectric thin-film is kept and used to promote bonding between the device layer and the carrier substrate, and to provide partial temperature compensation.

In embodiments, passive voltage gain device is suspended above the first material (e.g., carrier substrate) using one or more suspension elements or structures (not shown). In embodiments, the passive voltage gain device is suspended above a cavity that is disposed between the piezoelectric thin-film and the first material (e.g., carrier substrate). The cavity can contain an inert gas or be in a vacuum. In some embodiments, one or more passive voltage gain devices can be fabricated on the first material to create an array of passive voltage gain devices. For example, an array of passive voltage gain device can be fabricated on a carrier substrate where the passive voltage gain devices are configured to receive and compress electrical signals with different frequency characteristics.

In some embodiments, to enable the suspension of the piezoelectric thin-film, the carrier material is regionally removed for the intended area of release and refilled with a sacrificial material before the piezoelectric thin-film is disposed on the carrier substrate. After disposing the sacrificial material, the carrier substrate includes regions with filled sacrificial materials. To suspend the passive voltage gain device, the sacrificial can be removed.

The disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms, operations, and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the disclosure is not described with reference to any particular programming language. It will be appreciated that a variety of programming languages can be used to implement the teachings of the disclosure as described herein.

The disclosure can be provided as a computer program product, or software, that can include a machine-readable medium having stored thereon instructions, which can be used to program a computer system (or other electronic devices) to perform a process according to the disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an implementation" or "one implementation" or "an embodiment" or "one embodiment" or the like throughout is not intended to mean the same implementation or implementation unless described as such. One or more implementations or embodiments described herein may be combined in a particular implementation or embodiment. The terms "first," "second," "third," "fourth," etc. as used herein are meant as labels to distinguish among different elements and may not necessarily have an ordinal meaning according to their numerical designation.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An apparatus, comprising:
   a piezoelectric thin-film suspended above a carrier substrate, the piezoelectric thin-film having a horizontal axis orientated along a length of the piezoelectric thin-film and a center axis orientated along a width of the piezoelectric thin-film, wherein the horizontal axis is perpendicular to the center axis, and wherein the piezoelectric thin-film comprises a first side and a second side with respect to the center axis;

an input interdigital transducer (IDT) comprising first interdigitated electrodes disposed at different locations along the horizontal axis and on the first side of the piezoelectric thin-film, wherein each opposing pair of the first interdigitated electrodes is to selectively transduce a particular frequency range of an input electrical signal, which varies in frequency over time, into an acoustic wave of a laterally vibrating mode based on a pitch between electrodes of the respective opposing pair, and wherein the pitch varies across respective opposing pairs of the first interdigitated electrodes; and an output IDT comprising second interdigitated electrodes disposed at different locations along the horizontal axis and on the second side of the piezoelectric thin-film, wherein each opposing pair of the second interdigitated electrodes corresponds to a respective opposing pair of the first interdigitated electrodes of equal pitch, and wherein each opposing pair of the second interdigitated electrodes is to convert the acoustic wave transduced by the respective opposing pair of the first interdigitated electrodes into an output signal of a corresponding frequency range, and wherein a plurality of frequency components of the output signals concurrently interfere to form a compressed pulse.

2. The apparatus of claim 1, wherein a first electrode of a first opposing pair of the first interdigitated electrodes is coupled to an input bus line, wherein a second electrode of the first opposing pair of the first interdigitated electrodes is coupled to an input ground line, wherein a third electrode of a first corresponding opposing pair of the second interdigitated electrodes is coupled to an output bus line, and wherein a fourth electrode of the first corresponding opposing pair of the second interdigitated electrodes is coupled to an output ground line.

3. The apparatus of claim 1, wherein the acoustic wave travels within the piezoelectric thin-film in at least one of a shear-horizontal (SH0) laterally vibrating mode or a length extensional (S0) laterally vibrating mode, and wherein the piezoelectric thin-film comprises lithium niobate thin-film.

4. The apparatus of claim 1, wherein the acoustic wave travels within the piezoelectric thin-film in at least one of a shear-horizontal (SH0) laterally vibrating mode, a length extensional (S0) laterally vibrating mode, a first order thickness extensional (S1) mode, or a thickness shear (A1) mode.

5. The apparatus of claim 1, wherein the piezoelectric thin-film comprises one of lithium niobate thin-film, lithium tantalate thin-film, aluminum nitride thin-film, scandium doped aluminum nitride thin-film, potassium niobate thin-film, or potassium tantalite thin-film.

6. The apparatus of claim 1, wherein the piezoelectric thin-film comprises one of X-cut, Z-cut, Y-cut, rotated X-cut, rotated Z-cut, or rotated Y-cut piezoelectric thin-film and comprises one of lithium niobate thin-film, lithium tantalate thin-film, potassium niobate thin-film, or potassium tantalite thin-film, or wherein the piezoelectric thin-film comprises c-axis grown aluminum nitride thin-film or c-axis grown scandium doped aluminum nitride thin-film.

7. The apparatus of claim 1, wherein the input IDT and the output IDT are symmetric about the center axis, wherein a first opposing pair of the first interdigitated electrodes is nearest to the center axis and is located an identical distance from the center axis as a corresponding first opposing pair of the second interdigitated electrodes of first equal pitch, and wherein a second opposing pair of the first interdigitated electrodes is farthest from the center axis and is located an identical distance from the center axis as a corresponding second opposing pair of the second interdigitated electrodes of second equal pitch.

8. The apparatus of claim 1, wherein the input electrical signal received at the input IDT is an input chirp signal with a bandwidth (B) and a duration (T) that varies in frequency over time, wherein frequency components of the input chirp signal are collected at the output IDT concurrently to form the compressed pulse, and wherein power of the input chirp signal is condensed resulting in an instantaneous power amplification of a time-bandwidth (TB) product to signal.

9. The apparatus of claim 1, wherein the input electrical signal received at the input IDT comprises discrete frequency components arranged in an order in time, wherein the discrete frequency components of the input electrical signal are collected at the output IDT concurrently to form the compressed pulse having a voltage gain greater than one.

10. The apparatus of claim 1, wherein acoustic waves of the laterally vibrating mode are to propagate through the piezoelectric thin-film with different delay times that are proportional to distances between each opposing pair of the second interdigitated electrodes and the corresponding opposing pair of the first interdigitated electrodes of equal pitch, and wherein a phase velocity of the acoustic waves of different frequencies is an identical phase velocity.

11. The apparatus of claim 1, further comprising a cavity disposed between the piezoelectric thin-film and the carrier substrate.

12. The apparatus of claim 1, wherein the piezoelectric thin-film comprises an electromechanical coupling coefficient greater than 10 percent.

13. The apparatus of claim 1, wherein the pitches of opposing pairs of the first interdigitated electrodes vary along the horizontal axis.

14. A system comprising:
an antenna to receive an input electrical signal that varies in frequency over time; and
a passive voltage gain device, coupled with the antenna, the passive voltage gain device comprising:
 a piezoelectric thin-film suspended above a carrier substrate, the piezoelectric thin-film having a horizontal axis orientated along a length of the piezoelectric thin-film and a center axis orientated along a width of the piezoelectric thin-film, wherein the horizontal axis is perpendicular to the center axis, and wherein the piezoelectric thin-film comprises a first side and a second side with respect to the center axis;
 an input interdigital transducer (IDT) comprising first interdigitated electrodes disposed at different locations along the horizontal axis and on the first side of the piezoelectric thin-film, wherein each opposing pair of the first interdigitated electrodes is to selectively transduce a particular frequency range of the input electrical signal into an acoustic wave of a laterally vibrating mode based on a pitch between electrodes of the respective opposing pair, and wherein the pitches of opposing pairs of the first interdigitated electrodes vary along the horizontal axis; and
 an output IDT comprising second interdigitated electrodes disposed at different locations along the horizontal axis and on the second side of the piezoelectric thin-film, wherein each opposing pair of the second interdigitated electrodes corresponds to a respective opposing pair of the first interdigitated electrodes of equal pitch, wherein each opposing pair of the second interdigitated electrodes is to convert the acoustic wave transduced by the respective opposing pair of the first interdigitated electrodes into an output signal of a corresponding frequency range, and wherein a plurality of frequency components of the output signals concurrently interfere to form a compressed pulse.

15. The system of claim 14, wherein the piezoelectric thin-film comprises one of X-cut, Z-cut, Y-cut, rotated X-cut, rotated Y-cut, or rotated Z-cut piezoelectric thin-film and comprises one of lithium niobate thin-film, lithium tantalate thin-film, potassium niobate thin-film, or potassium tantalite thin-film, or wherein the piezoelectric thin-film comprises c-axis grown aluminum nitride thin-film or c-axis grown scandium doped aluminum nitride thin-film.

16. The system of claim 14, wherein the acoustic wave travels within the piezoelectric thin-film in at least one of a shear-horizontal (SH0) laterally vibrating mode, a length extensional (S0) laterally vibrating mode, a first order thickness extensional (S1) mode, or a thickness shear (A1) mode, wherein the piezoelectric thin-film comprises one of lithium niobate thin-film, lithium tantalate thin-film, aluminum nitride thin-film, scandium doped aluminum nitride thin-film, potassium niobate thin-film, or potassium tantalite thin-film.

17. The system of claim 14, wherein the input electrical signal is a monotonic electrical signal that varies in frequency over time.

18. The system of claim 14, wherein the input electrical signal comprises discrete frequency components that are arranged in an order in time.

* * * * *